(12) United States Patent
Kerber et al.

(10) Patent No.: US 7,215,259 B2
(45) Date of Patent: May 8, 2007

(54) DATA COMPRESSION WITH SELECTIVE ENCODING OF SHORT MATCHES

(75) Inventors: Galen G. Kerber, Lafayette, CO (US); Jeffrey A. Riley, Westminster, CO (US); Bijan Eskandari-Gharnin, Littleton, CO (US)

(73) Assignee: Quantum Corporation, San Jose, CA (US)

( * ) Notice: Subject to any disclaimer, the term of this patent is extended or adjusted under 35 U.S.C. 154(b) by 0 days.

(21) Appl. No.: 11/179,080

(22) Filed: Jul. 11, 2005

(65) Prior Publication Data

US 2006/0273933 A1    Dec. 7, 2006

Related U.S. Application Data

(63) Continuation-in-part of application No. 11/144,253, filed on Jun. 3, 2005, now abandoned.

(51) Int. Cl.
*H03M 7/34* (2006.01)
(52) U.S. Cl. ......................................... 341/51; 341/106
(58) Field of Classification Search .................. 341/50, 341/67, 65, 106, 51
See application file for complete search history.

(56) References Cited

U.S. PATENT DOCUMENTS

| | | | |
|---|---|---|---|
| 4,701,745 A | 10/1987 | Waterworth | 341/63 |
| 5,003,307 A | 3/1991 | Whiting et al. | 341/51 |
| 5,016,009 A | 5/1991 | Whiting et al. | 341/67 |
| 5,146,221 A * | 9/1992 | Whiting et al. | 341/67 |
| 5,155,484 A * | 10/1992 | Chambers, IV | 341/55 |
| 5,369,605 A | 11/1994 | Parks | 708/20 |
| 5,485,526 A * | 1/1996 | Tobin | 382/232 |
| 5,506,580 A * | 4/1996 | Whiting et al. | 341/51 |
| 5,602,764 A * | 2/1997 | Eskandari-Gharnin et al. | 708/210 |
| 5,771,010 A * | 6/1998 | Masenas | 341/51 |
| 5,805,086 A * | 9/1998 | Brown et al. | 341/51 |
| 5,956,724 A * | 9/1999 | Griffiths | 707/101 |
| 6,906,644 B2 * | 6/2005 | Satoh | 341/51 |

* cited by examiner

*Primary Examiner*—Peguy JeanPierre
(74) *Attorney, Agent, or Firm*—Morrison & Foerster LLP

(57) ABSTRACT

A method and apparatus for encoding a sequence of input data into a sequence of coded data, where the coded data is represented as literal data, as single-character references to recent input data, and as a references to one or more past input data. The references may be fixed in length or variable in length. The references may include an indication of a match offset and/or an indication of a match length.

34 Claims, 17 Drawing Sheets

| No. | New Byte | 601 Previous MR | 602 Shift MR | 501 LM(NB) | 603 AND | 606 M Cont | 607 Next MR | match count | match offset |
|-----|----------|-----------------|--------------|------------|---------|------------|-------------|-------------|--------------|
| 1 | A | 0000 0000 | 0000 0000 | 0000 0000 | 0000 0000 | 0 | 0000 0000 | 0 | - |
| 2 | B | 0000 0000 | 0000 0000 | 0000 0000 | 0000 0000 | 0 | 0000 0000 | 0 | - |
| 3 | A | 0000 0000 | 0000 0000 | 1000 0000 | 0000 0000 | 0 | 1000 0000 | 1 | 2 |
| 4 | C | 1000 0000 | 0100 0000 | 0000 0000 | 0000 0000 | 0 | 0000 0000 | 0 | - |
| 5 | B | 0000 0000 | 0000 0000 | 0100 0000 | 0000 0000 | 0 | 0100 0000 | 1 | 3 |
| 6 | A | 0100 0000 | 0010 0000 | 1010 0000 | 0010 0000 | 1 | 0010 0000 | 2 | 3 |
| 7 | C | 0010 0000 | 0001 0000 | 0001 0000 | 0001 0000 | 1 | 0001 0000 | 3 | 3 |
| 8 | A | 0001 0000 | 0000 1000 | 1010 0000 | 0000 0000 | 0 | 1010 0000 | 1 | 2 |
| 9 | D | 1010 0000 | 0101 0000 | 0000 0000 | 0000 0000 | 0 | 0000 0000 | 0 | - |

```
Note to No. 1:
    LM(NB)=0 & match count = 0 therefore
        (1) code current A as literal
Note to No. 2:
    LM(NB)=0 & previous match count = 0 therefore
        (2) code current B as literal
Notes to No. 4:
    LM(NB)=0 & previous match count >= 1 therefore
        (3) code previous → (Match Offset:Match Length)=(2:1)
        (4) code current C as literal
Note to No. 8:
    LM(NB)<>0 & AND=0 & previous match count >= 1 therefore
        (5) code previous → (Match Offset:Match Length)=(3:3)
Note to No. 9:
    LM(NB)=0 & previous match count >= 1 therefore
        (6) code previous → (Match Offset:Match Length)=(2:1)
        (7) code current D as literal Sequence of 9 New Bytes:
    A B A C B A C A D Results of 7 codes:
    Literal A, Literal B, (2:1), Literal C, (3:3), (2:1), Literal D
```

FIGURE 9A

| No. | New Byte | 601 Previous MR | 602 Shift MR | 501 LM(NB) | 603 AND | 605 OR | Next MR | match count | match offset |
|---|---|---|---|---|---|---|---|---|---|
| 1 | A | 0000 0000 | 0000 0000 | 0000 0000 | 0000 0000 | 0 | 0000 0000 | 0 | – |
| 2 | A | 0000 0000 | 0000 0000 | 1000 0000 | 0000 0000 | 0 | 1000 0000 | 1 | 1 |
| 3 | A | 1000 0000 | 0100 0000 | 1100 0000 | 0100 0000 | 1 | 0100 0000 | 2 | 1 |
| 4 | A | 0100 0000 | 0010 0000 | 1110 0000 | 0010 0000 | 1 | 0010 0000 | 3 | 1 |
| 5 | A | 0010 0000 | 0001 0000 | 1111 0000 | 0001 0000 | 1 | 0001 0000 | 4 | 1 |
| 6 | B | 0001 0000 | 0000 1000 | 0000 0000 | 0000 0000 | 0 | 0000 0000 | 0 | – |

Note to No. 1:
    LM(NB)=0 & match count = 0 therefore
        (1) code current A as literal Notes to No. 6:
    LM(NB)=0 & previous match count >= 1 therefore
        (2) code previous → (Match Offset:Match Length)=(1:4)
        (3) code current B as literal Sequence of 6 New Bytes:
    A A A A A B Results of 3 codes:
    Literal A, (1:4), Literal B

Encoding type flag 60E / Reference Information 70E

| | | | |
|---|---|---|---|
| 0 | Match offset (single-char) 80 | | |
| 1 | 0 | Match offset (long-length, fixed-length) 91 | Match length (fixed-length) 95 |
| 1 | 1 | Match offset (long-length, fixed-length) 91 | Match length (variable-length) 96 |

FIGURE 15B

Encoding type flag 60F / Reference Information 70F

| | | | |
|---|---|---|---|
| 0 | Match offset (single-char) 80 | | |
| 1 | 0 | Match offset (long-length, fixed-length) 91 | Match length (fixed-length) 95 |
| 1 | 1 | Match offset (long-length, variable-length) 92 | Match length (fixed-length) 95 |

FIGURE 15C

Encoding type flag 60G / Reference Information 70G

| | | | |
|---|---|---|---|
| 0 | Match offset (single-char) 80 | | |
| 1 | 0 | Match offset (long-length, fixed-length) 91 | Match length (fixed-length) 95 |
| 1 | 1 | Match offset (long-length, variable-length) 92 | Match length (variable-length) 96 |

FIGURE 15D

Encoding type flag 60H / Reference Information 70H

| | | | |
|---|---|---|---|
| 0 | Match offset (single-char) 80 | | |
| 1 | 0 | Match offset (long-length, fixed-length) 91 | Match length (variable-length) 96 |
| 1 | 1 | Match offset (long-length, variable-length) 92 | Match length (fixed-length) 95 |

FIGURE 15E

Encoding type flag 60I / Reference Information 70I

| | | | |
|---|---|---|---|
| 0 | Match offset (single-char) 80 | | |
| 1 | 0 | Match offset (long-length, fixed-length) 91 | Match length (variable-length) 96 |
| 1 | 1 | Match offset (long-length, variable-length) 92 | Match length (variable-length) 96 |

Match length (fixed-length)

| x | x | x | x | x | x | x | x | x | x |
|---|---|---|---|---|---|---|---|---|---|

Bit  .0  .1  .2  .3  .4  .5  .6  .7  .8  .9     95

FIGURE 19A

Match length (variable length)

| | Bit .0 | .1 | .2 | .3 | .4 | .5 | .6 | .7 | .8 | .9 |
|---|---|---|---|---|---|---|---|---|---|---|
| Group A | 0 | 0 | x | | | | | | | |
| Group B | 0 | 1 | x | x | | | | | | |
| Group C | 1 | 0 | x | x | x | | | | | |
| Group D | 1 | 1 | x | x | x | x | x | x | x | x |

97 Group indictor       96

FIGURE 19B

Length of string match encoded with variable-length bit pattern     96

| | Bit .0 | .1 | .2 | .3 | .4 | .5 | .6 | .7 | .8 | .9 | Length of String Match |
|---|---|---|---|---|---|---|---|---|---|---|---|
| Group A | 0 | 0 | 0 | | | | | | | | 2 |
|  | 0 | 0 | 1 | | | | | | | | 3 |
| Group B | 0 | 1 | 0 | 0 | | | | | | | 4 |
|  | 0 | 1 | 0 | 1 | | | | | | | 5 |
|  | 0 | 1 | 1 | 0 | | | | | | | 6 |
|  | 0 | 1 | 1 | 1 | | | | | | | 7 |
| Group C | 1 | 0 | 0 | 0 | 0 | | | | | | 8 |
|  | 1 | 0 | 0 | 0 | 1 | | | | | | 9 |
|  | 1 | 0 | 0 | 1 | 0 | | | | | | 10 |
|  | 1 | 0 | 0 | 1 | 1 | | | | | | 11 |
|  | 1 | 0 | 1 | 0 | 0 | | | | | | 12 |
|  | 1 | 0 | 1 | 0 | 1 | | | | | | 13 |
|  | 1 | 0 | 1 | 1 | 0 | | | | | | 14 |
|  | 1 | 0 | 1 | 1 | 1 | | | | | | 15 |
| Group D | 1 | 1 | 0 | 0 | 0 | 0 | 0 | 0 | 0 | 0 | 16 |
|  | 1 | 1 | 0 | 0 | 0 | 0 | 0 | 0 | 0 | 1 | 17 |
|  | ... | ... | ... | ... | ... | | | | | | ... |
|  | 1 | 1 | 1 | 1 | 1 | 1 | 1 | 1 | 1 | 1 | 271 |

97 Group indictor

FIGURE 19C

DATA COMPRESSION WITH SELECTIVE ENCODING OF SHORT MATCHES

CROSS-REFERENCE TO RELATED APPLICATIONS

This application is a continuation-in-part of patent application Ser. No. 11/144,253, filed Jun. 3, 2005 is now abandoned, the disclosure of which is herein incorporated by reference in its entirety.

BACKGROUND OF THE INVENTION

1. Field of the Invention

The present invention relates generally to high speed data compression and to high speed data compression devices and systems.

2. Description of the Related Art

Prior to data storage, raw data may be encoded into a fewer number of bits for more efficient use of a storage medium. Upon retrieval the encoded data may be decoded to provide the original raw data. Similarly, prior to data transmission, raw data may be compressed for more efficient use of a transmission channel. Upon reception, the compressed data may be decompressed with a decoding process.

A number of compression techniques have been developed. Some compression techniques use lossless compression algorithms and other techniques use lossy compression algorithms. If no errors have occurred during storage or transmission, a lossless compression-decompression scheme provides the original data, while a lossy scheme may result in data similar to the original data but not necessarily the same. Some compression techniques encode data into fixed length segments, while others encode data into variable length segments. Some compression techniques involve the use of hashing, which minimizes the number of locations that need to be read and compared to find matching strings. Some compression techniques involve the use of shift registers with broadcast functions where the input character is compared to every location in the shift register in a single cycle. Some compression techniques involve the use of Content-Addressable memory (CAM), which compares the input character to every location in the memory in a single cycle.

BRIEF SUMMARY OF THE INVENTION

A method and apparatus for encoding a sequence of input data into a sequence of coded data, where the coded data is represented as literal data, as single-character references to recent input data, and as a references to one or more past input data. The references may be fixed in length or variable in length. The references may include an indication of a match offset and/or an indication of a match length.

Some embodiments of the present invention provide a method of encoding digital data, the method comprising: searching for a match between a current one or more segments of data and a corresponding one or more past segments of data; coding the current segment of data as a literal if no match exists; coding the match as a reference if the match exists and the match length greater than 1; and if the match exists and a match length is 1: determining if a match offset is less than a threshold; coding the match as a single-character reference, if the match offset is less than the threshold; and coding the match as a literal, if the match offset is greater than the threshold.

Some embodiments of the present invention provide a method of encoding a stream of data segments, the method comprising: loading a segment of data from the stream of data segments; determining if the segment of data matches a past segment of data; if the segment of data does not match past data: determining if a pending match exists; encoding the pending match as a single-character match if the pending match exists and if a match offset is less than a threshold; encoding the pending match as a literal if the pending match exists and if the match offset is greater than the threshold; and encoding the segment of data as literal data; and if the segment of data matches past data: incrementing a match length if a continuing match exists; encoding the pending match as a single-character match if the pending match exists, no continuing match exists and the match offset is less than a threshold; and encoding the pending match as a literal if the pending match exists, no continuing match exists and the match offset is greater than the threshold.

Some embodiments of the present invention provide an encoder comprising: encoding logic, wherein the encoding logic includes a table of match offsets to single-characters and a table of match offsets of long length; and string matching logic coupled to the encoding logic, wherein the string matching logic includes a locate memory operable to identify locations of repeated occurrences of the past data segments and a match register coupled to the locate memory.

Some embodiments of the present invention provide a parallel encoder for encoding a source of data, the parallel encoder comprising: a plurality of serial encoders, wherein each serial encoder includes: encoding logic having an input and an output, wherein the encoding logic includes a table of match offsets to single-characters, and a table of match offsets of long length; and string matching logic coupled to the encoding logic, wherein the string matching logic includes a history buffer operable to hold past data segments, a locate memory operable to identify locations of repeated occurrences of the past data segments, and a match register coupled to the locate memory; a head control including: an input coupled to the source of data; and a plurality of outputs, each output coupled to the input of a corresponding one of the plurality of serial encoders; and a tail control including: a plurality of inputs, each input coupled to the output of a corresponding one of the plurality of serial encoders; and an output providing a coded data stream.

Some embodiments of the present invention provide a parallel decoder for decoding a source of encoded data, the parallel decoder comprising: a plurality of serial decoders, wherein each serial decoder includes: decoding logic, wherein the decoding logic includes a table of match offsets to single-characters and a table of match offsets of long length; and a history buffer operable to hold decoded data segments; a head control including: an input coupled to the source of encoded data; and a plurality of outputs, each output coupled to the input of a corresponding one of the plurality of serial decoders; and a tail control including: a plurality of inputs, each input coupled to the output of a corresponding one of the plurality of serial decoders; and an output providing a decoded data stream.

Some embodiments of the present invention provide a method of decoding coded data, the method comprising: determining a beginning of coded data; reading a flag indicating whether the coded data contains literal data or an encoded representation; if the flag indicates literal data, extracting a literal length of data thereby forming a segment of decoded data; if the flag indicates the encoded representation: reading an encoding-type flag indicating whether the encoded representation includes a single-character match offset or a long-length match offset; if the encoding-type flag indicates the single-character match offset: determining the single-character match offset; and determining a value from a history buffer corresponding to the single-character match offset, thereby forming the segment of decoded data; and if the encoding-type flag indicates the long-length match offset: determining the long-length match offset; determining a match length; and reading one or more values from the history buffer corresponding to the long-length match offset and the match length, thereby forming a corresponding one or more segments of decoded data.

Some embodiments of the present invention provide a magnetic tape drive comprising: an encoder including: encoding logic, wherein the encoding logic includes a table of match offsets to single-characters and a table of match offsets of long length; and string matching logic coupled to the encoding logic, wherein the string matching logic includes a locate memory operable to identify locations of repeated occurrences of the past data segments and a match register coupled to the locate memory; and a decoder including: decoding logic, wherein the decoding logic includes a table of match offsets to single-characters and a table of match offsets of long length; and a history buffer operable to hold decoded data segments.

Some embodiments of the present invention provide a method of encoding a stream of data, the method comprising: selecting from three formats a format to encode a segment of the stream of data, wherein: a first format represents the segment as a literal including the segment; a second format represents the segment as a reference including an offset to a single-character match to a previous segment, wherein the previous segment is determined to be within a threshold offset; and a third format represents the segment as a reference including an indication of a match offset and an indication of a match length.

Some embodiments of the present invention provide a method of encoding a stream of data, the method comprising: selecting from four formats a format to encode a segment of the stream of data, wherein: a first format represents the segment as a literal including the segment; a second format represents the segment as a reference including an offset to a single-character match to a previous segment, wherein the previous segment is determined to be within a threshold offset; a third format represents the segment as a reference including an offset to a double-character match to a previous segment; and a fourth format represents the segment as a reference including an indication of a match offset and an indication of a match length.

Other features and aspects of the invention will become apparent from the following detailed description, taken in conjunction with the accompanying drawings which illustrate, by way of example, the features according to embodiments of the present invention. The summary is not intended to limit the scope of the invention, which is defined solely by the claims attached hereto.

BRIEF DESCRIPTION OF THE DRAWINGS

FIGS. 6A and 6B show a process of updating a history buffer and a locate memory with a new segment of data.

FIGS. 8 and 9A–9B illustrate a hardware implementation of a match register and a locate memory according to embodiments of the present invention.

FIGS. 14A to 14D, 15A to 15H and 16 show various structures of coded data according to embodiments of the present invention.

FIGS. 19A to 19C show a table of match lengths according to embodiments of the present invention.

DETAILED DESCRIPTION OF THE INVENTION

In the following description, reference is made to the accompanying drawings which illustrate several embodiments of the present invention. It is understood that other embodiments may be utilized and mechanical, compositional, structural, electrical, and operational changes may be made without departing from the spirit and scope of the present disclosure. The following detailed description is not to be taken in a limiting sense, and the scope of the embodiments of the present invention is defined only by the claims of the issued patent.

Some portions of the detailed description are presented in terms of procedures, steps, logic blocks, processing, and other symbolic representations of operations on data bits that can be performed on computer memory. A procedure, computer executed step, logic block, process, etc., are here conceived to be a self-consistent sequence of steps or instructions leading to a desired result. The steps are those utilizing physical manipulations of physical quantities. These quantities can take the form of electrical, magnetic, or radio signals capable of being stored, transferred, combined, compared, and otherwise manipulated in a computer system. These signals may be referred to at times as bits, values, elements, symbols, characters, terms, numbers, or the like. Each step may be performed by hardware, software, firmware, or combinations thereof.

Figure 1:
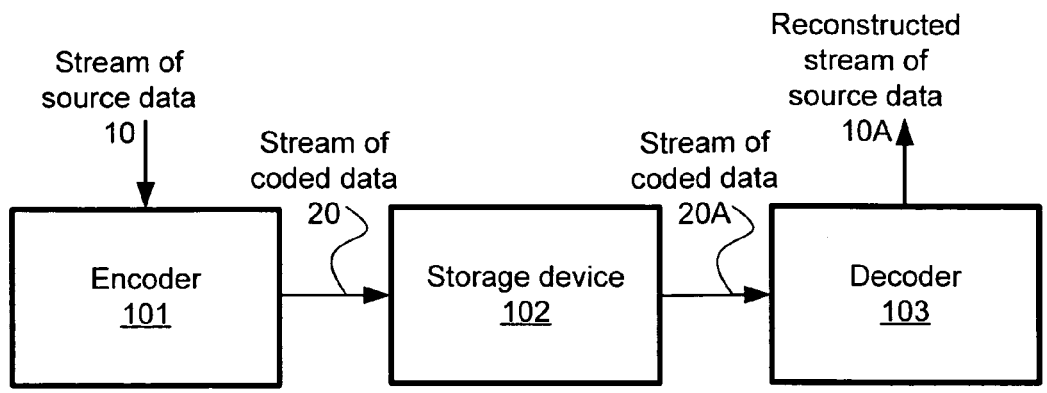
FIG. 1 shows an encoder/decoder system according to embodiments of the present invention.

FIG. 1 shows an encoder/decoder system according to embodiments of the present invention. The encoder/decoder system uses an encoder 101 to convert a stream of source data 10 to a stream of coded data 20. The coded data stream 20 may be written to a storage device 102. The storage device 102 may include a magnetic storage medium such as a hard disk drive or a magnetic tape. Alternatively, the stream of coded data 20 may be transmitted via a data channel to a receiver. The stream of coded data 20A may be read from the storage device 102 and decoded by a decoder 103 to produce a reconstructed stream of source data 10A. The encoder/decoder system may be used for high speed data compression on data requiring rapid compression, for example, data stored to a storage device such as a magnetic tape using in a tape drive, a magnetic medium of a hard disk drive, or an optical disk using an optical disk drive.

Figure 2:
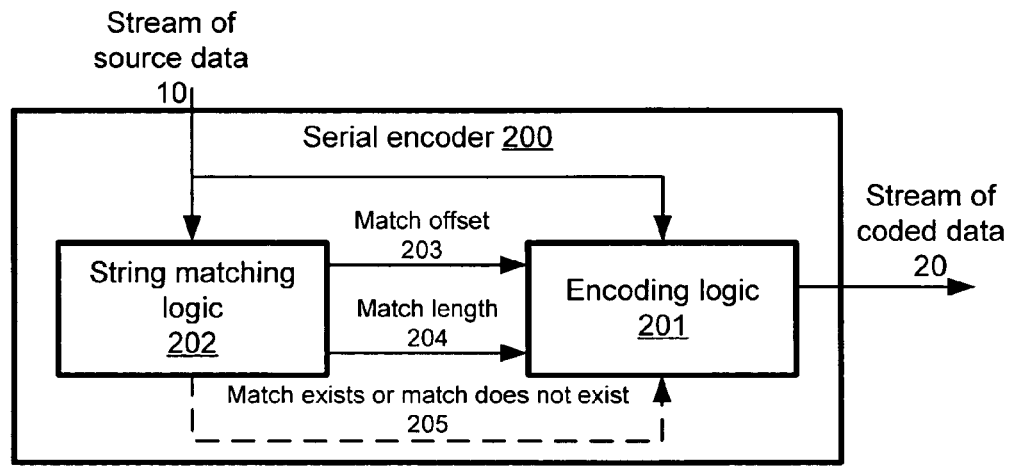
FIG. 2 shows a serial encoder according to embodiments of the present invention.

FIG. 2 shows a serial encoder 200 according to embodiments of the present invention. The encoding process of encoder 101 may be performed by a serial encoder 200 including encoding logic 201 and string matching logic 202. The string matching logic 202 accepts a stream of source data 10, and determines if one or more recent segments of source data matches a corresponding number of past segments of source data.

The string matching logic 202 may produce a sequence of match offsets 203. A match offset describes a number of segments away from a current sequence of source data that a previous matching sequence of source data may be found.

The string matching logic 202 may also produce a corresponding sequence of match lengths 204. A match length indicates a number of segments in a match. According to some embodiments, a match length of one means that a single-character match is detected. According to other embodiments, a match length of zero means that a single-character match is detected.

The string matching logic 202 may also produce a control signal 205 that indicates whether a match exists or a match does not exist between a current portion of the source data stream 10 and a previous portion of the source data stream 10. If a match exists, the encoding logic 201 may encode the match in terms of the match offset and match length. If a match does not exist, the encoding logic 201 will encode the current segment of the source data stream 10 as literal data.

Figure 3:
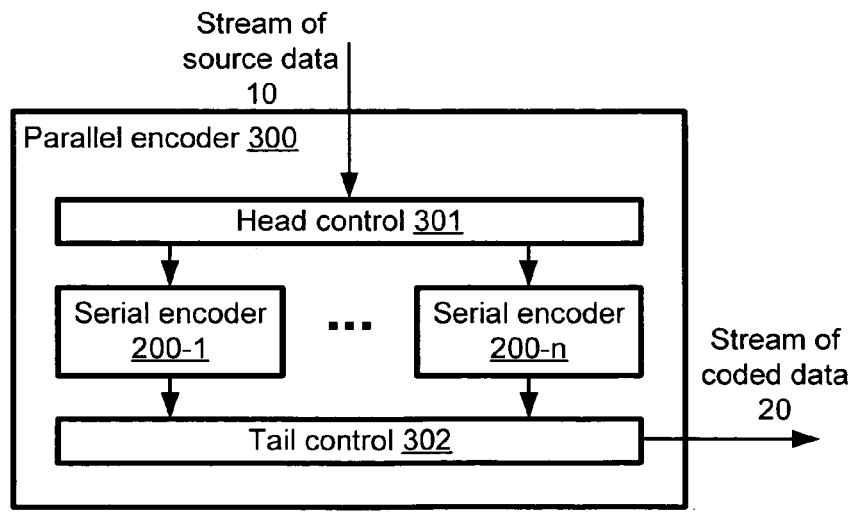
FIG. 3 shows a parallel encoder according to embodiments of the present invention.

FIG. 3 shows a parallel encoder 300 according to embodiments of the present invention. A parallel encoder 300 includes multiple compression engines or serial encoders 200, and automatically spreads the work of encoding across the individual serial encoders 200-1 to 200-$n$, thereby increasing the overall performance.

The encoding process of encoder 101 may be performed by a parallel encoder 300 including a head control 301, multiple serial encoders 200-1 to 200-$n$, and a tail control 302. The head control 301 has an input that accepts a stream of source data 10. The head control 301 divides the stream of source data 10 in to multiple sub-streams. Each of the sub-streams represents a non-overlapping portion of the stream of source data 10 and are provided to a respective serial encoder 200-1 to 200-$n$. Each of the serial encoders 200-1 to 200-$n$ produces a coded data sub-stream, which are provided to the tail control 302. The tail control 302 multiplexes the coded data sub-streams to produce a stream of coded data 20.

The head control 301 of the parallel encoder 300 may partition or format the incoming data into blocks of data, where each block of data is compressed independently of all other blocks. The head control 301 may also select which serial encoder each block is sent to for encoding. Each block may be routed to a different serial encoder. The head control 301 may use a number of different algorithms for determining which serial encoder should be used for a given block of data, for example, a round-robin and emptiest node scheme. Each serial encoder 300-1 to 300-$n$ may have its own head FIFO to stage the incoming data. Each serial encoder 300-1 to 300-$n$ may also have its own tail FIFO to help ensure that the assembly order of the compressed segments are maintained as compressed data stream is output to a device. The head control 301 may maintain a segment control field over each block of data that is passed through the serial encoder 300-1 to 300-$n$, including any head FIFO or tail FIFO, unchanged. The segment control field may be written to the tail FIFO prior to any compressed data stream from the serial encoder. The segment control field may have a number of different formats, including using sequential numbering or a leading CRC. The head control 301 may use a data record size that is passed in, and may produce a first record pointer that may be used during decoding to determine where the first data record is located within a block of encoded data.

The tail control 302 of the parallel encoder may monitor the tail FIFOs of each serial encoder 200-1 to 200-$n$. The tail control 302 may determine which serial encoder contains the next sequential segment by inspecting a segment control field present in each serial encoder's tail FIFO. The tail control 302 may ensure that blocks of encoded data are sent out in the same order the corresponding blocks of data entered the serial encoders 200-1 to 200-$n$. The tail control 302 may strip off the segment control field from the blocks of encoded data before outputting the data as a stream of coded data.

Figure 4:
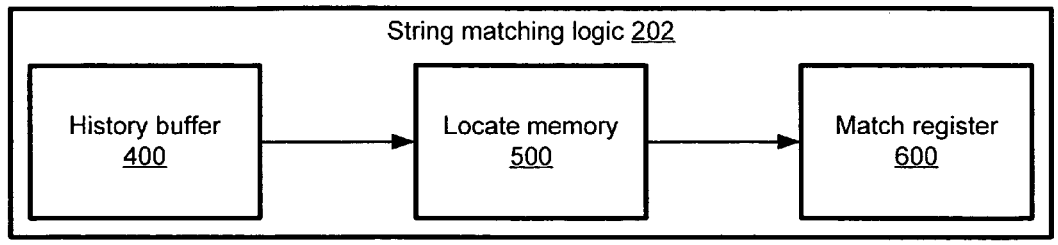
FIG. 4 illustrates string match logic according to embodiments of the present invention.

FIG. 4 illustrates string match logic 202 according to embodiments of the present invention. The string matching logic 202 includes a history buffer 400, a locate memory 500, and a match register 600. The history buffer 400 holds at least a portion the stream of source data 10. The string matching logic 202 writes new segments of data as they are received from the stream of source data 10. The history buffer 400 may be formed in memory, such as in RAM or on a storage device such as a hard disk drive. The string matching logic 202 writes new segments of data to the history buffer 400.

Once full, the history buffer 400 may operate as a circular buffer where new data overwrites old data. Alternatively, the string matching logic 202 may reset the history buffer 400 after the history buffer 400 becomes full. By resetting the history buffer 400, the string matching logic 202 effectively resets to an initial state, thereby limiting the perpetuating of errors introduced between encoding and decoding.

The locate memory 500 may be considered a bit map memory. The depth of the memory is equal to at least the number of possible values of an input segment of data. The bit width of the locate memory 500 may be equal to the maximum number of values that are held in the history buffer 400. The string matching logic 202 may operate on the locate memory 500 on bit-by-bit basis.

The match register 600 may be used to determine a match offset. The bit width of the match register 600 is also equal to at least the number of values that may be held in the history buffer 400. The string matching logic 202 may also operate on the match register 600 on bit-by-bit basis.

Figure 5:
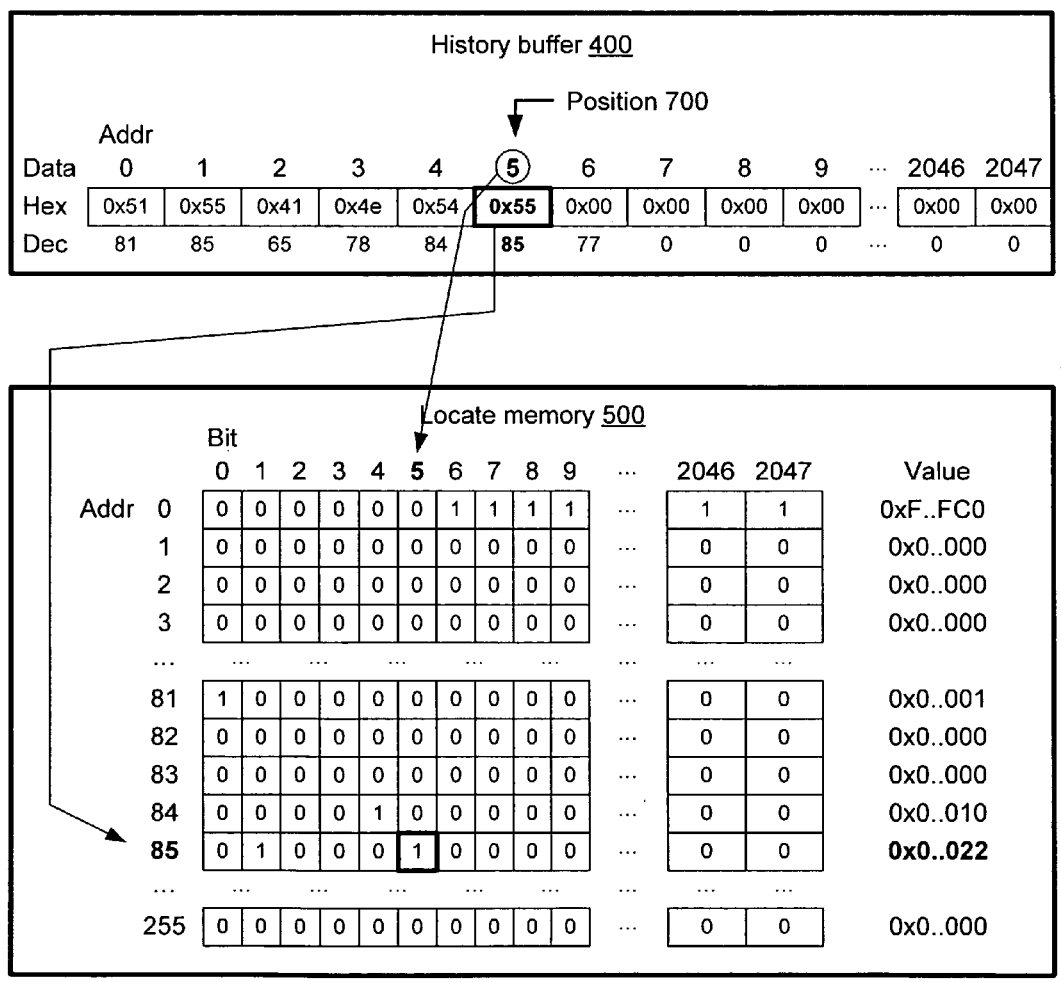
FIG. 5 shows a relationship between a history buffer and a locate memory according to embodiments of the present invention.

FIG. 5 shows a relationship between a history buffer 400 and a locate memory 500 according to embodiments of the present invention. The history buffer 400 shown contains locations for 2048 segments of data. Each segment is shown to be one 8-bit byte. As a new byte of data is received, the string matching logic 202 places it in the next available position 700.

The locate memory 500 contains 256 addressable memory locations; one address exists for each possible value of new bytes received. Each memory location contains a unique bit corresponding to a unique value and location in the history buffer 400. In the example shown, the locate memory 500 is 2048 bits wide. This means that the locate memory 500 ends up being sparsely populated with ones; each bit position will have only one address where the bit is set to one. Advantageously, to find the locations in the history buffer 400 that have a value of 0x55 (85 decimal), the string matching logic 202 just needs to read address 85 in the locate memory 500, and all locations in the addressed memory location that correspond to locations in the history buffer 400 that have a 0x55 will have a bit set to one.

The history buffer 400 is shown filed with six bytes of data in addresses 0 through 5. The most recent received byte, represented as hexadecimal 0x55 or equivalently decimal 85, is placed in the position indicated as current position 700. In this example, the current position 700 is address 5. Unfilled positions from address 6 to the end of memory at address 2047 are shown filled with zeros.

Each combination of byte value and position in the history buffer 400 corresponds to a bit position in the locate memory 500. For example, the history buffer 400 at address 0 contains a hexadecimal value 0x51 or equivalently a decimal value 81. In the locate memory 500 at address 81 in bit position 0, which corresponds to history buffer 400 having value 81 at address 0, the bit is set to one. All other bits in that column (bit position 0) of the locate memory 500 have a bit reset to zero.

Similarly, the history buffer 400 at address 5 contains a hexadecimal value 0x55 or equivalently a decimal value 85. In the locate memory 500 at address 85 in bit position 5, which corresponds to history buffer 400 having value 85 at address 5, a bit is set to one. All other bits in that column of the locate memory 500 have the bit reset to zero.

For each new byte placed in the history buffer 400, a corresponding bit is set in the locate memory 500. The resulting locate memory 500 may be used to quickly determine where in the history buffer 400 any one value is located. For example, to determine where in the history buffer 400 a hexadecimal value of 0x55 or equivalently a decimal value of 85 is located, the string matching logic 202 may access address 85 of the locate memory 500. Each bit set to one in memory of address 85 represents a position in the history buffer 400 containing the decimal value 85.

Figures 6A, 6B:
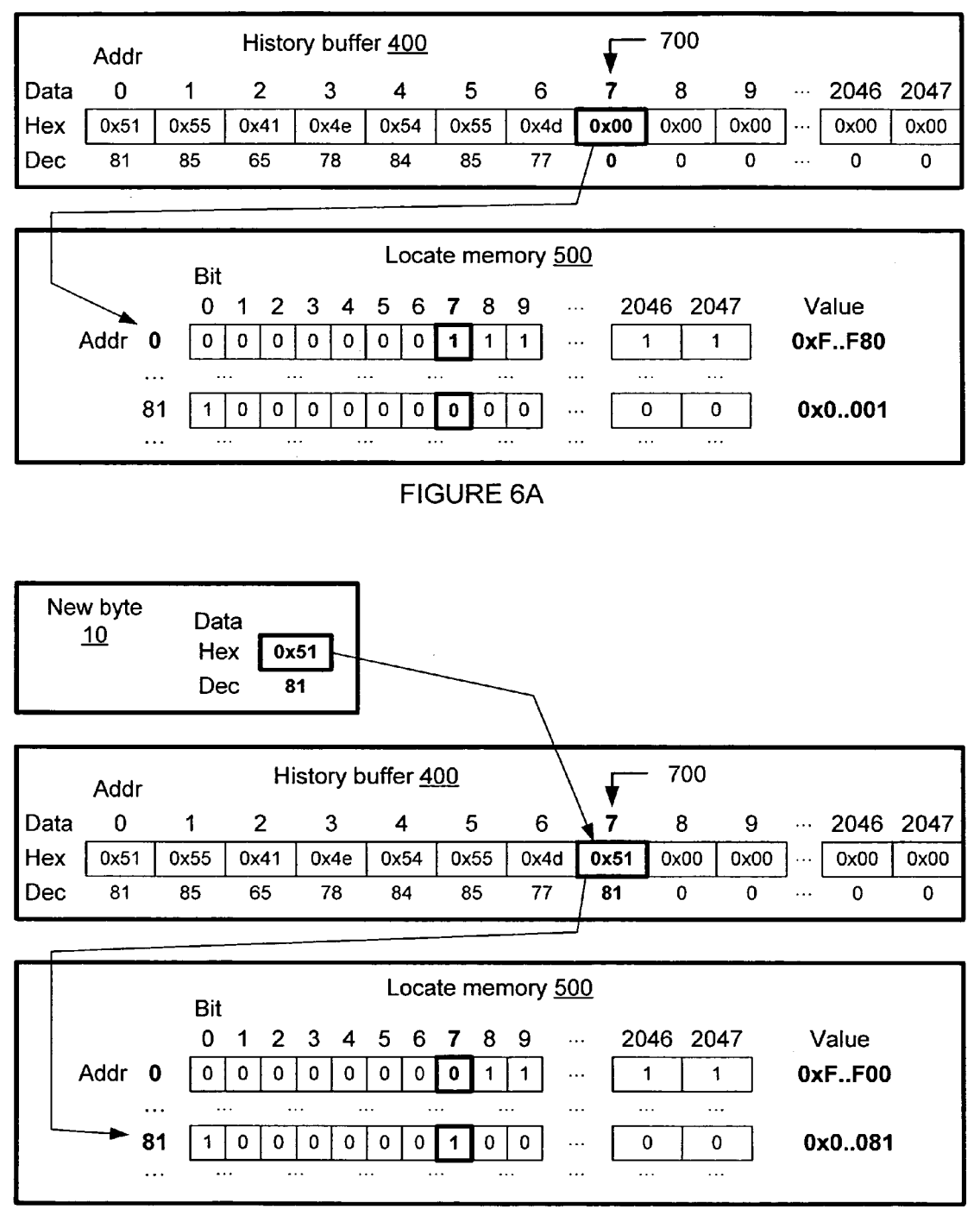

FIGS. 6A and 6B show a process of updating a history buffer 400 and a locate memory 500 with a new segment of data. For a new byte received, the string matching logic 202 first prepares the locate memory 500 for the new byte by resetting the previously set bit.

In FIG. 6A, the next new byte will be written to position 700, which points to address 7 in the history buffer 400. The current value in the history buffer 400 is read and a bit in the locate memory 500 corresponding to the read value and position 700 is reset. In this case the value is 0x00 is read from the history buffer 400 at address 7. The string matching logic 202 accesses location 0 in the locate memory 500, which corresponds to read value 0x00. In bit position 7, which corresponds to address 7 in the history buffer 400, a bit previously set to 1 is reset to 0.

In FIG. 6B, bit position 7 of address 0 in the locate memory 500 has been reset to 0. A new byte 10 having a value of 0x51 (decimal 81) is written to position 700 of the history buffer 400. Bit position 7 of address 81, which corresponds to value 81 at the address 7 in the history buffer 400, is set to 1. The value in address 81 of the locate memory 500 indicates that value 0x51 is located in the history buffer 400 in two positions, at address 0, which corresponds to the set bit in bit position 0, and at address 7, which corresponds to the set bit in position 7.

When a new byte 10 having a particular value arrives, the string matching logic 202 may determine when that particular value was last received by examining the corresponding address in the locate memory 500. In the example shown, a value of 0x51 was received seven bytes earlier. Therefore, an encoder may code the new byte 10 as a reference to the byte received seven positions earlier. That is, it may encode a match offset of 7 rather than the literal value of 0x51.

Figure 7:
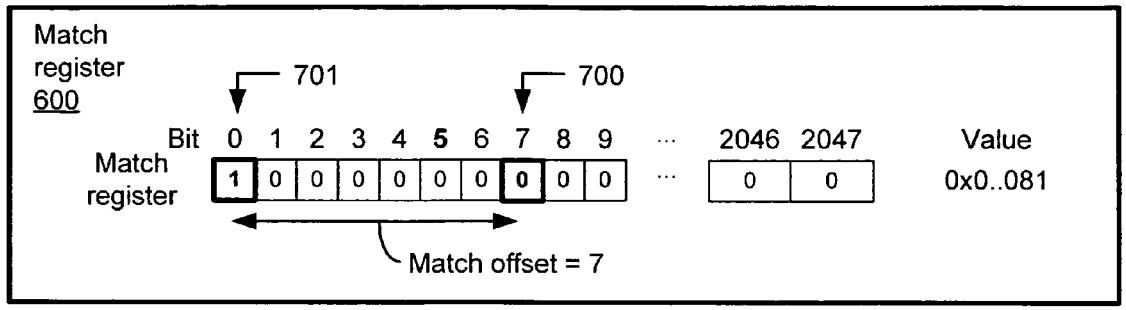
FIG. 7 illustrates the use of a match register 600 according to embodiments of the present invention.

FIG. 7 illustrates the use of a match register 600 according to embodiments of the present invention. The match register 600 may be used to determine whether a match exists and the offset to that match. The match register 600 may be initialized 0. After processing, as described below, the match register 600 may have a non-zero value. A non-zero value in the match register 600 indicates that a match to a previous one or more characters has been detected. In the example shown, the current position 700 is at bit 7, which corresponds to a new byte being placed into the history buffer 400 at address 7. The number of bits from the current position 700 to the closest set bit 701 indicates the match offset. Here, there are 7 bits from the current position 700 to the first set bit 701 at bit position 0. Therefore, the match exists and the match offset is 7.

Figure 8:
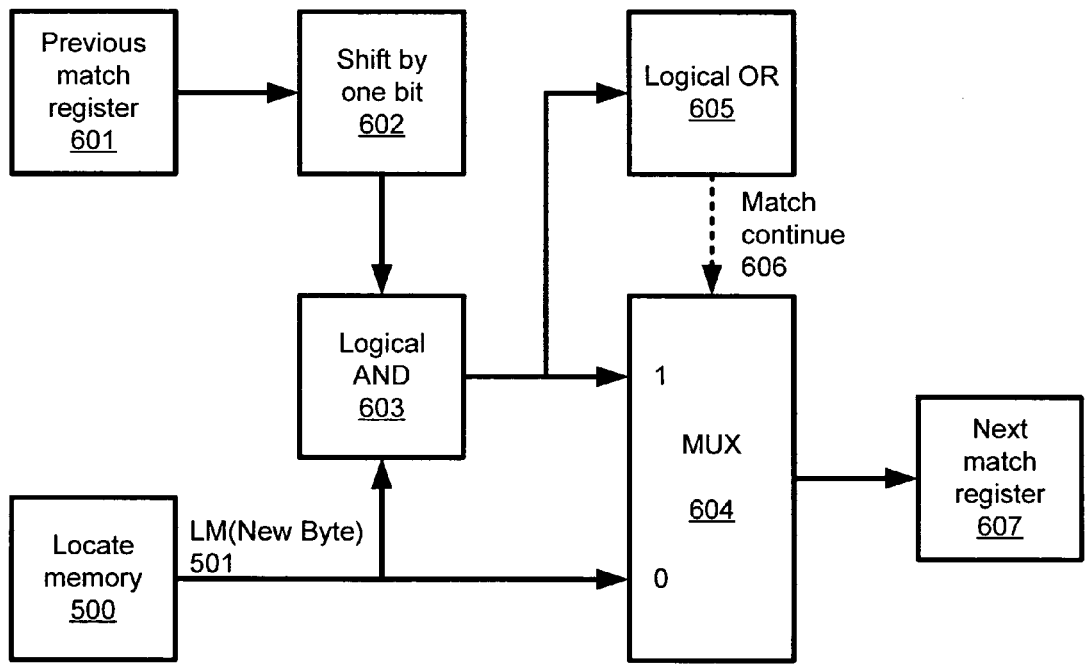

FIGS. 8 and 9A–9B illustrate a hardware implementation of a match register and a locate memory according to embodiments of the present invention. FIG. 8 illustrates hardware that may by used to update a value in the match register 600. FIGS. 9A and 9B show examples of sequences of incoming data and resulting pairs of match offsets and match lengths.

A match register 600 is iteratively updated by the hardware each time a new byte is received. The resulting match register (next match register 607) is used during the next iteration as the initial match register (previous match register 601). Initially, the match register (previous match register 601) is initialized to zero.

Generally, the hardware performs a logical bit wise AND between a shifted version of the match register 601 and a value 501 in the locate memory 500 indexed by the byte received. A multiplexer 604 is used to select which of two values will be used to update the match register (next match register 607) to be used in subsequent calculations.

Specifically, a previous match register value 601 (e.g., having 2048 bits) is shifted by one bit 602 and provided to a first set of inputs to a set of logical AND gates 603. The shift operation 602 may be performed by wiring bits 0, 1, 2, . . . of the match register 601 to respective inputs at bits 1, 2, 3, . . . of the logical AND gate 603. The shift operation 602 may be a barrel shift thereby resulting in the last bit of the match register 601 being wired to bit 0 of the logical AND gate 603. A second set of inputs to the logical AND gate 603 is provided by a value 501 from the locate memory 500 indexed by the value of the new byte received.

A multiplexer 604 (or equivalently a set of switches) has inputs for two values. The first value is provided by the value 501 from the locate memory 500 indexed by the new byte. The second value is provided by the output of the logical AND operation 603. The output of the logical AND operation 603 is also provided to a logical OR operation 605. The logical OR operation 605 has an output (match continue 606) that is equal to zero if all bits from the logical AND 603 are zero and is equal to one if any one or more bits from the logical AND 603 is one. The match continue bit 606 is used as a selection bit to the multiplexer 604. If the match continue bit 606 is zero, then the next match register 607 is clocked with the value 501. If the match continue bit 606 is one, then the next match register 607 is clocked with the value from the logical AND operation 603.

FIG. 9A shows resulting values from the hardware of FIG. 8 for an input sequence of bytes of "ABACBACAD".

For the first iteration, a new byte "A" is received. Prior to the arrival of any data, the match register 601 is initialized to zero (previous match register MR="0000 0000"). MR 601 is shifted ("0000 0000") and provided to a first set of inputs to the logical AND gates 603. The locate memory 500 is indexed by the new byte "A" resulting in value 501 ("0000 0000"), which is provided to a second set of inputs to the logical AND gates 603. The logical AND operation 603 results in "0000 0000", which is provided to the logical OR gate 605 and a first set of inputs to the multiplexer 604. The logical OR operation 605 results in a match continue bit 606 of zero. Therefore, the next match register 607 is loaded with the value 501. Because value 501 is zero and the match count is 0, the new byte "A" is coded as a literal.

In the second iteration, the next match register 607 from above becomes the previous match register 601 and the process of updating the match register 600 repeats with a new byte of "B". At the end of this iteration, the match continue bit 606 is zero, the value 501 is zero and the match count is also zero, therefore the new byte "B" is coded as a literal and the next match register 607 is set to value 501.

In the third iteration, a new byte of "A" results in the output of the logical OR 605 (match continue 606) equaling zero. Therefore, the value 501 ("1000 0000") used to fill the next match register 607. The value 501 from the located memory is not zero, which shows this new byte is the beginning of a new match. Thus, the match count is set to one. At the end of this iteration no code is written because the next new byte may extend the current match.

In the fourth iteration, a new byte of "C" is received. At the end of this iteration, the value 501 is zero but the match count is not zero, therefore the previous match ended and is coded as a reference with an offset equal to 2 and a length equal to 1. Also, the new byte "C" is coded as a literal.

In the fifth iteration, a new byte of "B" results in the output of the logical OR 605 (match continue 606) equaling zero. Therefore, the value 501 ("0100 0000") used to fill the next match register 607. The value 501 from the located memory is not zero, which shows this new byte is the beginning of a new match. Thus, the match count is set to one. At the end of this iteration no code is written because the next new byte may extend the current match.

In the sixth iteration, a new byte of "A" results in the output of the logical OR 605 (match continue 606) equaling one. Therefore, the output of the logical AND operation 603 ("0010 0000") is used to fill the next match register 607. The output of the logical AND is not zero, which shows this new byte continues the previous match. Thus, the match count is incremented. At the end of this iteration no code is written because the next new byte may extend the current match.

In the seventh iteration, a new byte of "C" results in the output of the logical OR 605 (match continue 606) equaling one. Therefore, the Therefore, the output of the logical AND operation 603 ("0001 0000") is used to fill the next match register 607. The output of the logical AND is not zero, which shows this new byte continues the previous match. Thus, the match count is incremented. At the end of this iteration no code is written because the next new byte may extend the current match.

In the eighth iteration, a new byte of "A" results in the output of the logical OR 605 (match continue 606) equaling zero. Therefore, the value 501 ("1010 0000") used to fill the next match register 607. The value 606 is zero but the previous match count is not zero, therefore the previous match ended and is coded as a reference with an offset equal to 3 and a length equal to 3. Also, the value 501 from the located memory is not zero, which shows this new byte is the beginning of a new match. Thus, the match count is set to one. At the end of this iteration only the previous ending match is written because the next new byte may extend the current match.

In the ninth iteration, a new byte of "D" is received. At the end of this iteration, the value 501 is zero but the match count is not zero, therefore the previous match ended and is coded as a reference with an offset equal to 2 and a length equal to 1. Also, the new byte "D" is coded as a literal.

FIG. 9B shows resulting values from the hardware of FIG. 8 for an input sequence of bytes of "AAAAAB".

For the first iteration, a new byte "A" is received. Prior to the arrival of any data, the match register 601 is initialized to zero (previous match register MR="0000 0000"). MR 601 is shifted ("0000 0000") and provided to a first set of inputs to the logical AND gates 603. The locate memory 500 is indexed by the new byte "A" resulting in value 501 ("0000 0000"), which is provided to a second set of inputs to the logical AND gates 603. The logical AND operation 603 results in "0000 0000", which is provided to the logical OR gate 605 and a first set of inputs to the multiplexer 604. The logical OR operation 605 results in a match continue bit 606 of zero. Therefore, the next match register 607 is loaded with the value 501. Because value 501 is zero and the match count is 0, the new byte "A" is coded as a literal.

In the second iteration, a new byte of "A" results in the output of the logical OR 605 (match continue 606) equaling zero. Therefore, the value 501 ("1000 0000") used to fill the next match register 607. The value 501 from the located memory is not zero, which shows this new byte is the beginning of a new match. Thus, the match count is set to one. At the end of this iteration no code is written because the next new byte may extend the current match.

In the third iteration, a new byte of "A" results in the output of the logical OR 605 (match continue 606) equaling one. Therefore, the output of the logical AND operation 603 ("0100 0000") is used to fill the next match register 607. The output of the logical AND is not zero, which shows this new byte continues the previous match. Thus, the match count is incremented. At the end of this iteration no code is written because the next new byte may extend the current match.

In the fourth iteration, a new byte of "A" results in the output of the logical OR 605 (match continue 606) equaling one. Therefore, the output of the logical AND operation 603 ("0010 0000") is used to fill the next match register 607. The output of the logical AND is not zero, which shows this new byte continues the previous match. Thus, the match count is incremented. At the end of this iteration no code is written because the next new byte may extend the current match.

In the fifth iteration, a new byte of "A" results in the output of the logical OR 605 (match continue 606) equaling one. Therefore, the output of the logical AND operation 603 ("0001 0000") is used to fill the next match register 607. The output of the logical AND is not zero, which shows this new byte continues the previous match. Thus, the match count is incremented. At the end of this iteration no code is written because the next new byte may extend the current match.

In the sixth iteration, a new byte of "B" is received. At the end of this iteration, the value 501 is zero but the match count is not zero, therefore the previous match ended and is coded as a reference with an offset equal to 1 and a length equal to 4. Also, the new byte "B" is coded as a literal.

Figure 10A:
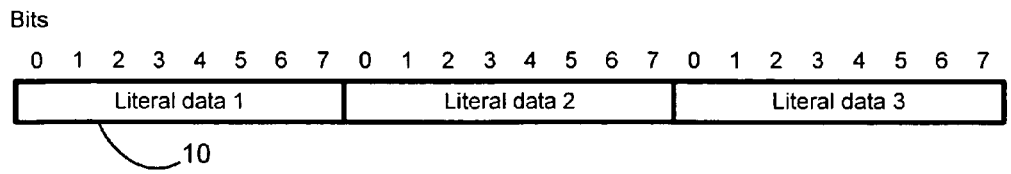
FIGS. 10A and 10B show a sequence of literal data and a sequence of coded data, respectively, according to embodiments of the present invention.
Figure 10B:
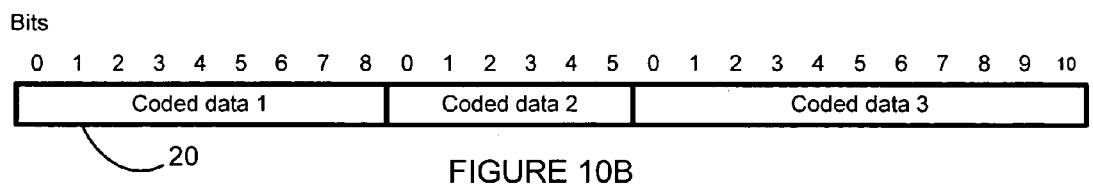

FIGS. 10A and 10B show a stream of source data 10 containing literal data and a stream of coded data 20, respectively, according to embodiments of the present invention. Literal data is data as it is received by the encoder. A stream of incoming source data 10 occupies a determinable number of bits. For example, three segments of 8-bit source data occupies 24 bits. In contrast, a stream of outgoing coded data 20 occupies an uncertain number of bits. In accordance to some embodiments, an 8-bit segment of incoming data may be coded, for example, as a 9-bit code or as a 6-bit code. Two 8-bit segments of incoming data may be coded as a bit sequence having 12 to 18 bits. Three 8-bit segments of incoming data may be coded as a bit sequence having 12 to 27 bits.

If a stream of source data 10 is coded as a stream of coded data 20 that occupies fewer bits, the stream of source data 10 has been compressed. With data having single-character and multiple-character patterns of repetition, a stream may be compressed. If the data is an ASCII paragraph of data, a space may be coded literally once and from then on as a reference. Repeated words may also be coded literally once and referenced for each additional occurrence.

Figure 11:
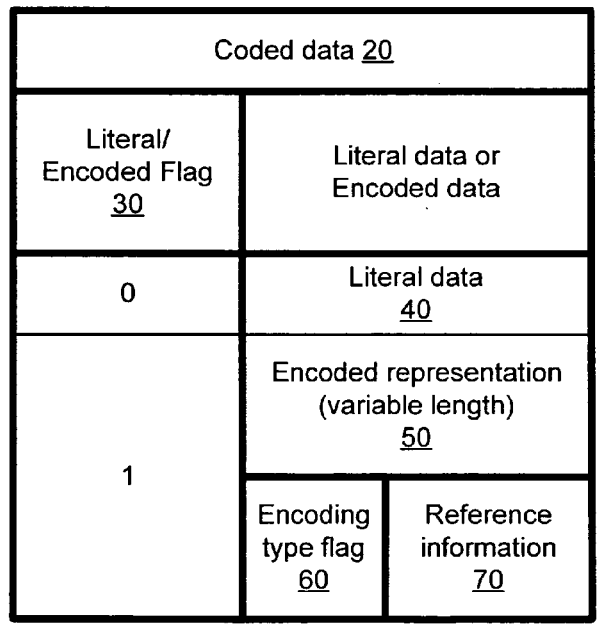
FIG. 11 shows a structure of coded data according to embodiments of the present invention.

FIG. 11 shows a structure of coded data 20 according to embodiments of the present invention. Coded data 20 may include a flag 30 that indicates whether the following bits represent literal data 40 or encoded data 50. If the flag 30 is set to indicate literal data (e.g., flag=0), then the next fixed number of bits represent the incoming literal data bits. The first occurrence of each value of incoming literal data 10 may be encoded as literal data 40.

If the flag 30 is set to indicate that encoded data follows (e.g., flag=1), the following encoded representation 50 is of variable length and may represent one or more segments of literal data 10. For example, the encoded representation 50 may reference a previously occurring sequence of characters.

The variable length encoded representation 50 includes an encoding type flag 60 and reference information 70. The encoding type flag 60 indicates the type of encoding used when encoding the reference information 70. In some embodiments, the encoding type flag 60 is fixed in length. In other embodiments, the encoding type flag 60 is variable in length. Example implementations of the encoded representation 50, the encoding type flag 60, and the reference information 70 are described in detail with reference to FIGS. 14 to 19 below.

Figure 12:
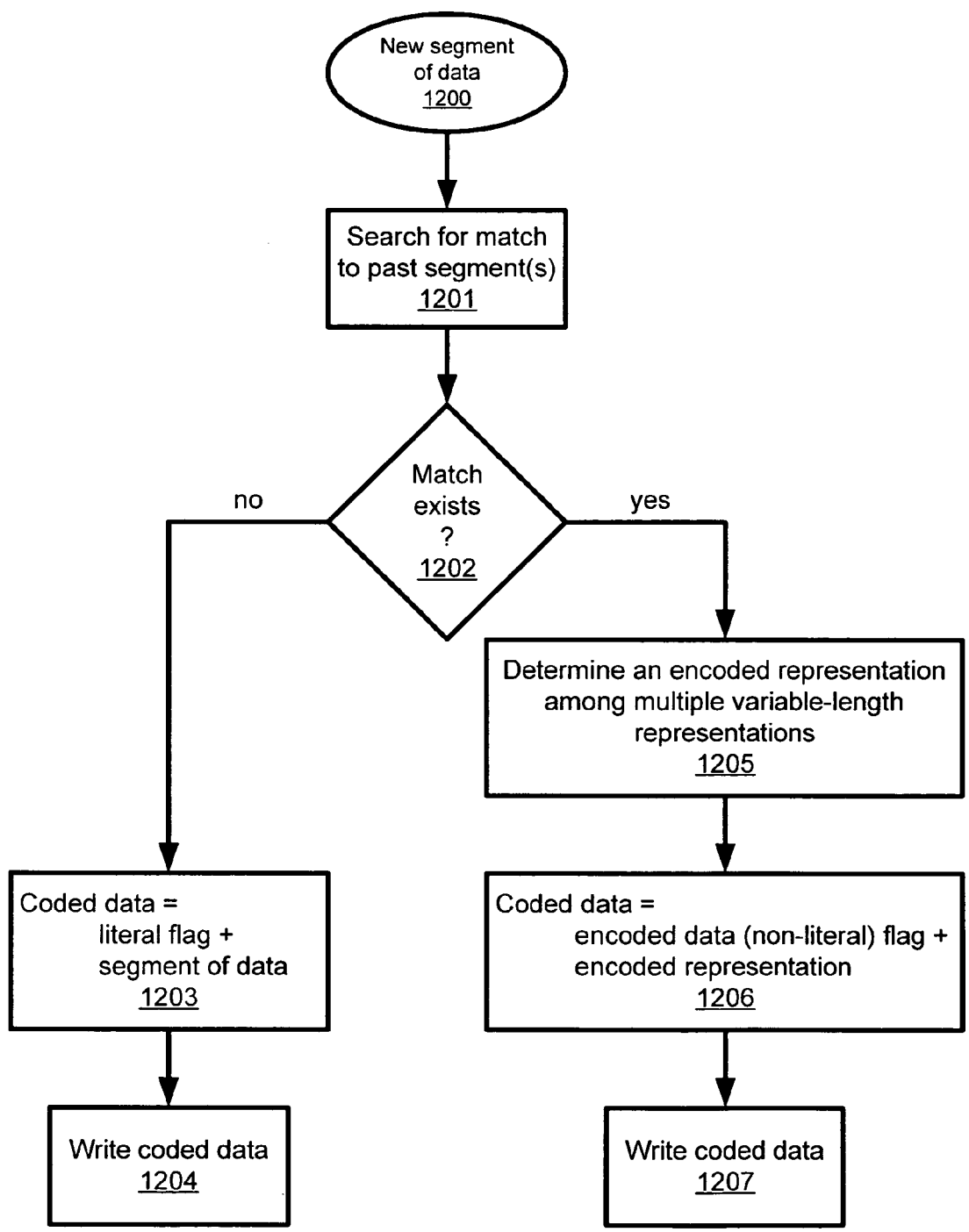
FIGS. 12 and 13 show a process of coding a segment of data according to embodiments of the present invention.
Figure 13:
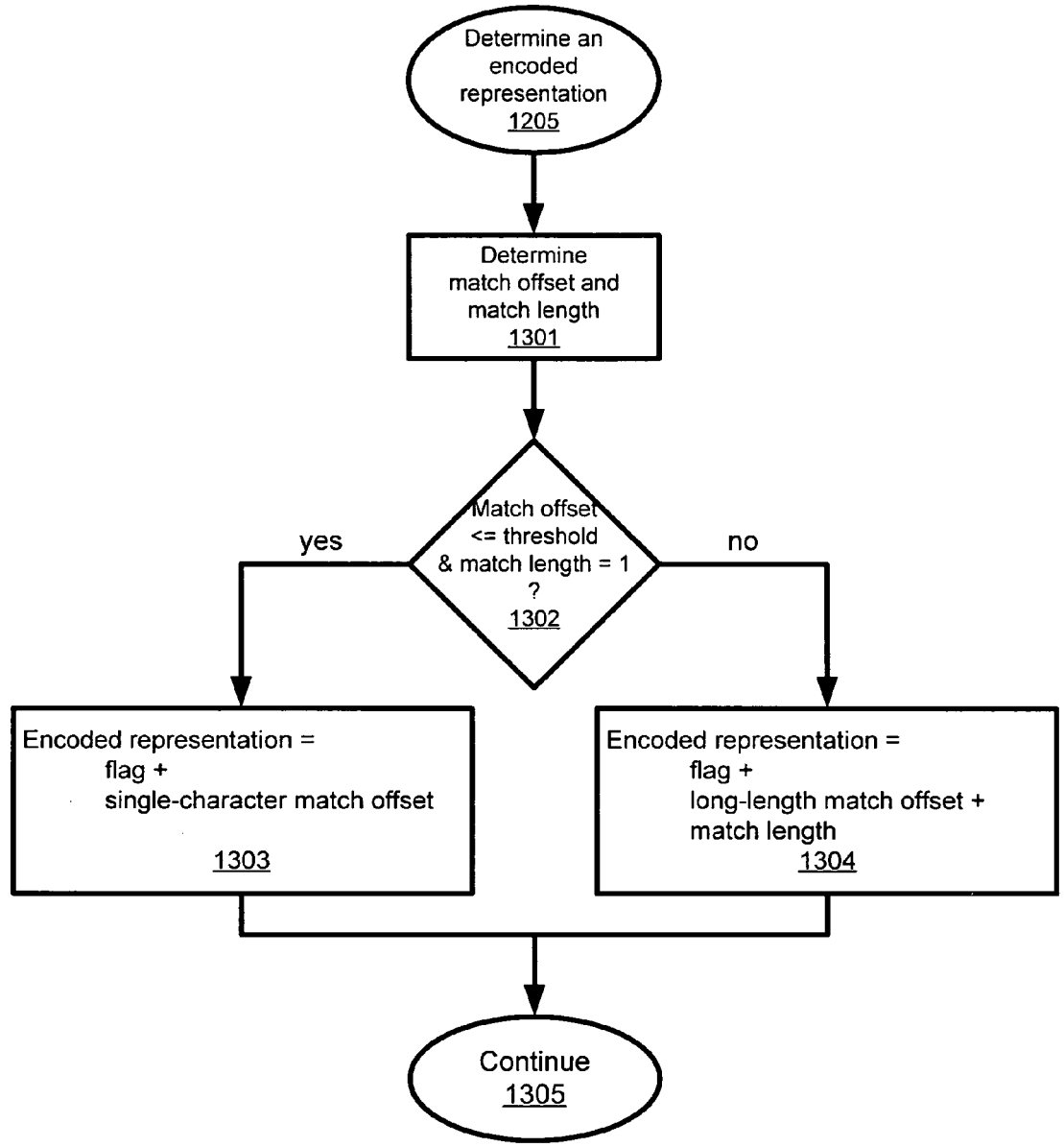

FIGS. 12 and 13 show a process of coding a stream of source data 10 according to embodiments of the present invention. At 1200, a new segment of incoming literal data is received from the stream of source data 10 by a serial encoder 200 and is provided to the string matching logic 202. At 1201, the string matching logic 202 adds the incoming segment of data to the history buffer 400 and updates the locate memory 500. The string matching logic 202 uses the match register 600 to process the locate memory 500 thereby determining whether a match exists, and if a match exists, the string matching logic 202 determines a Match offset from the match register 600.

At 1202, the encoding logic 201 determines whether to encode the incoming data 10 as literal data 40 if no match existed or as an encoded representation 50 if a match exists. At 1203, if no match exists, the coded data is set to include a flag 30 indicating literal data encoding and also to include a copy of the literal data 10 as literal data 40. At 1204, the coded data 20 is written.

If a match does exist, at 1205, the encoding logic 201 determines which encoded representation 50 among multiple variable-length representations to use. An example of this determination is described with reference to FIG. 13 below. Once the method of representation is selected, at 1206, the encoding logic 201 sets the coded data 20 to included a flag 30 representing encoded (non-literal) data encoding and also to include the encoded representation 50. For the encoded representation 50, encoding logic 201 sets an encoding type flag 60 and reference information 70.

At 1207, the encoded representation 50 may be written to a temporary buffer where it may be held until it is determined that the end of a repeating pattern has been found. If an additional new segment of data increases the match length, then the previous encoded representation 50 stored in the temporary buffer may be overwritten. That is, if a new segment of data 10 increases the match length from the previous match, the new representation 50 may replace the previous shorter match length representation 50. In this matter, a repeating pattern may be referenced with a single encoded representation 50. The coded data 20 may be written after it is determined that the next new data segment 10 will not increase the match length.

In FIG. 13, an example of determining an encoded representation of 1205 is shown. At 1301, the string matching logic 202 determines a match offset and a match length. At 1302, the encoding logic 201 determines whether the reference may be encoded as a single-character offset to a single match. The match offset is compared to a threshold length. For example, an offset requiring only 4 bits to represent an offset to a single character may be considered a single-character offset. In this case, if the match offset is less than or equal to 16 (i.e., the match is within the 16 previous incoming data segments), then the encoding logic 201 determines if the match length represents a single character match.

At 1303, if the match offset is a short-distance match and the match length represents a single character match, the encoding logic 201 sets the encoded representation 50 to include an encoding type flag 60, which is set to indicate single-character match offset encoding, and the reference information 70, which indicates the short distance to the single-character match.

At 1304, if the match offset is greater than the threshold or the match length is for more than a single character match, then the encoding logic 201 sets the encoded representation 50 to include an encoding type flag 60, which is set to indicate long-offset encoding, and to include the reference information 70, which indicates the distance to the single-character or multi-character match. At 1305, the encoding logic 201 continues processing.

FIGS. 14A to 14D, 15A to 15H and 16 show various structures of coded data according to embodiments of the present invention.

FIGS. 14A to 14D show implementations of an encoding type flag 60 that indicates whether single-character match offset encoding is used or long offset encoding is used.

Figure 14A:
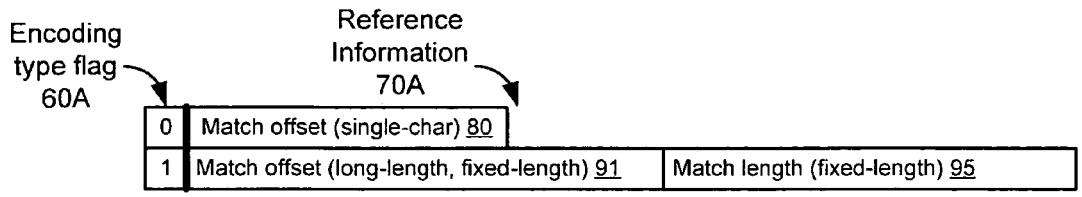

In the implementation of FIG. 14A, an encoding type flag 60A is followed by reference information 70A, where the encoding type flag 60A represents whether the reference information 70A includes a single-character match offset 80 or a pair of a fixed-length long match offset 91 and a fixed-length match length 95.

Figure 14B:
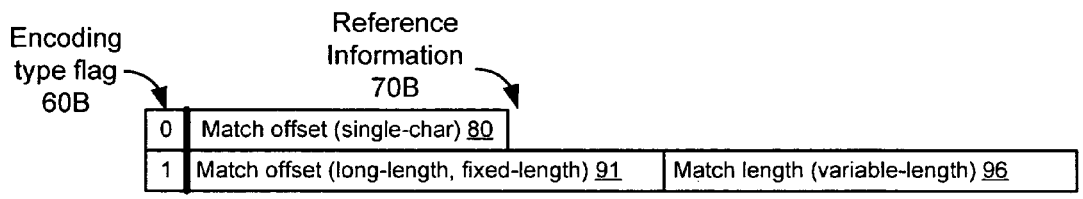

In the implementation of FIG. 14B, an encoding type flag 60B is followed by reference information 70B, where the encoding type flag 60B represents whether the reference information 70B includes a single-character match offset 80 or a pair of a fixed-length long match offset 91 and a variable-length match length 96.

Figure 14C:
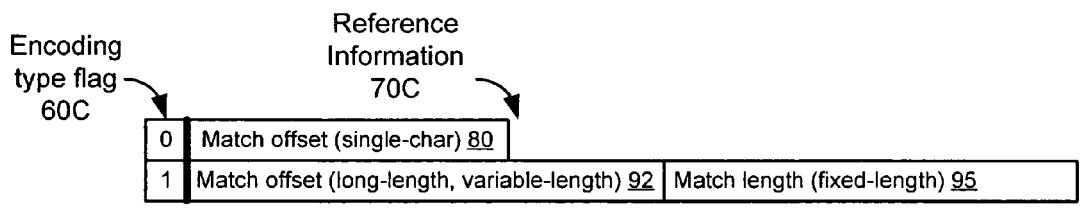

In the implementation of FIG. 14C, an encoding type flag 60C is followed by reference information 70C, where the encoding type flag 60C represents whether the reference information 70C includes a single-character match offset 80 or a pair of a variable-length long match offset 92 and a fixed-length match length 95.

Figure 14D:
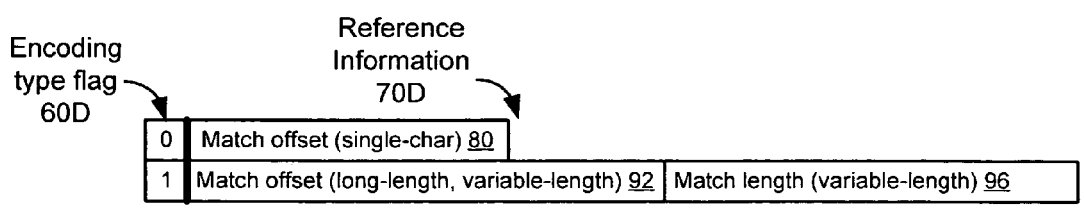

In the implementation of FIG. 14D, an encoding type flag 60D is followed by reference information 70D, where the encoding type flag 60D represents whether the reference information 70D includes a single-character match offset 80 or a pair of a variable-length long match offset 92 and a variable-length match length 96.

FIGS. 15A to 15H show implementations of an encoding type flag 60 that indicates whether a single-character match offset encoding is used or one of two long encoding schemes is used.

In the implementation of FIG. 15A, an encoding type flag 60E is followed by reference information 70E, where the encoding type flag 60E represents whether the reference information 70E includes a single-character match offset 80, a pair of a fixed-length long match offset 91 and a fixed-length match length 95, or a pair of a fixed-length long match offset 91 and a variable-length match length 96.

In the implementation of FIG. 15B, an encoding type flag 60F is followed by reference information 70F, where the encoding type flag 60F represents whether the reference information 70F includes a single-character match offset 80, a pair of a fixed-length long match offset 91 and a fixed-length match length 95, or a pair of a variable-length long match offset 92 and a fixed-length match length 95.

In the implementation of FIG. 15C, an encoding type flag 60G is followed by reference information 70G, where the encoding type flag 60G represents whether the reference information 70G includes a single-character match offset 80, a pair of a fixed-length long match offset 91 and a fixed-length match length 95, or a pair of a variable-length long match offset 92 and a variable-length match length 96.

In the implementation of FIG. 15D, an encoding type flag 60H is followed by reference information 70H, where the encoding type flag 60H represents whether the reference information 70H includes a single-character match offset 80, a pair of a fixed-length long match offset 91 and a variable-length match length 96, or a pair of a variable-length long match offset 92 and a fixed-length match length 95.

In the implementation of FIG. 15E, an encoding type flag 60I is followed by reference information 70I, where the encoding type flag 60I represents whether the reference information 70I includes a single-character match offset 80, a pair of a fixed-length long match offset 91 and a variable-length match length 96, or a pair of a variable-length long match offset 92 and a variable-length match length 96.

Figure 15F:
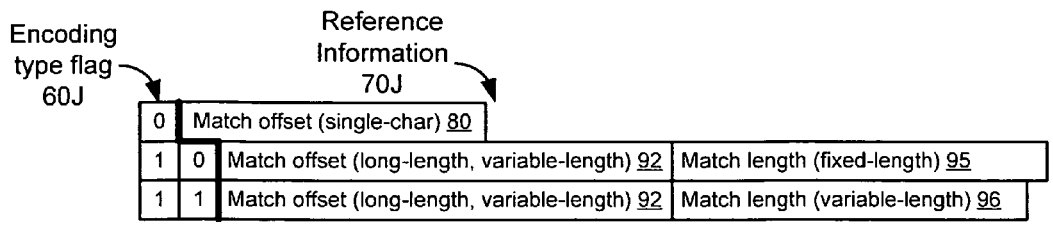

In the implementation of FIG. 15F, an encoding type flag 60J is followed by reference information 70J, where the encoding type flag 60J represents whether the reference information 70J includes a single-character match offset 80, a pair of a variable-length long match offset 92 and a fixed-length match length 95, or a pair of a variable-length long match offset 92 and a variable-length match length 96.

Figure 15G:
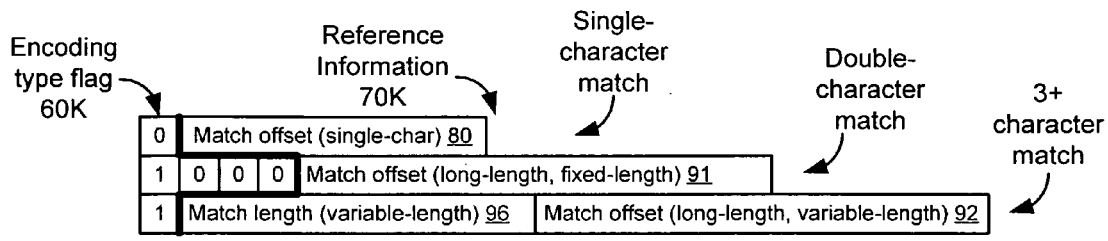

In the implementation of FIG. 15G, an encoding type flag 60K is followed by reference information 70K, where the encoding type flag 60K represents whether the reference information 70K includes a single-character match offset 80, a double-character match including a fixed-length match offset 91, or a pair of a variable-length match length 96 and a variable-length match offset 92.

Figure 15H:
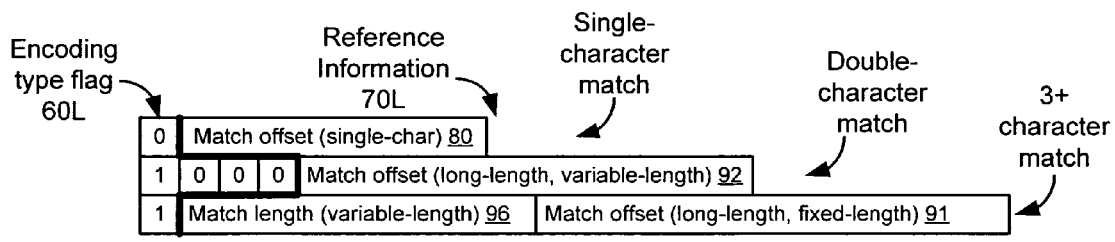

In the implementation of FIG. 15H, an encoding type flag 60L is followed by reference information 70L, where the encoding type flag 60L represents whether the reference information 70L includes a single-character match offset 80, a double-character match including a variable-length match offset 92, or a pair of a variable-length match length 96 and a fixed-length long match offset 91.

Figure 16:
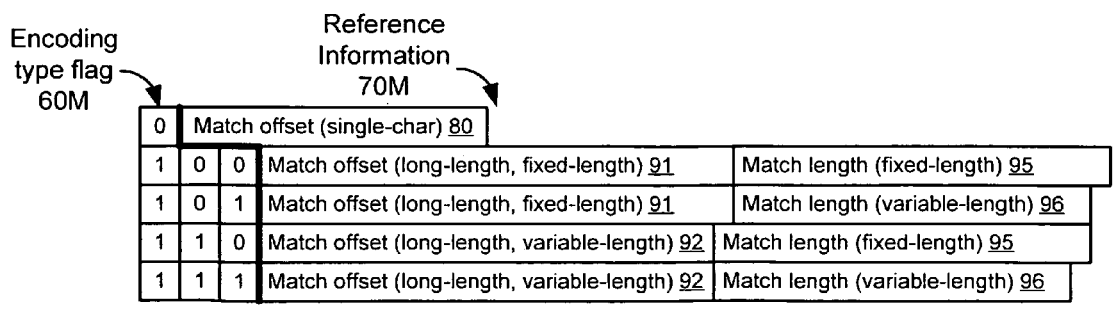

FIG. 16 shows implementations of an encoding type flag 60M followed by reference information 70M, where the encoding type flag 60M indicates whether the reference information 70M includes a single-character match offset encoding or one of four long encodings. A first value of the encoding type flag 60M represents whether a single-character match offset 80 is coded. A second value of the encoding type flag 60M represents whether a pair of a fixed-length long match offset 91 and a fixed-length match length 95 is coded. A third value of the encoding type flag 60M represents whether a pair of a fixed-length long match offset 91 and a variable-length match length 96 is coded. A fourth value of the encoding type flag 60M represents whether a pair of a variable-length long match offset 92 and a fixed-length match length 95 is coded. A fifth value of the encoding type flag 60M represents whether a pair of a variable-length long match offset 92 and a variable-length match length 96 is coded.

Figures 17A, 17B:
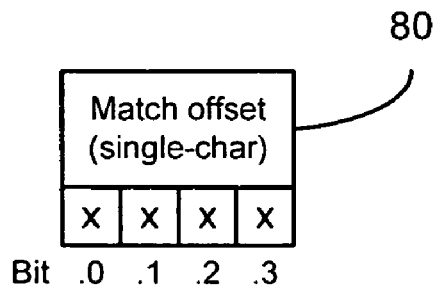
FIGS. 17A and 17B show a table of match offsets to a single character according to embodiments of the present invention.

FIGS. 17A and 17B show a table of match offsets to a single character according to embodiments of the present invention. A single-character match offset 80 may be set to a number of bits less than a long-length match offset 91 or 92. For example, a single-character match offset may contain four bits (bits 0.0 to 0.3). Incremental values of the match offset table may represent incremental values of a match offset. For example, a bit pattern of 1011 may represent a match offset of 12 as shown.

Figure 18A:
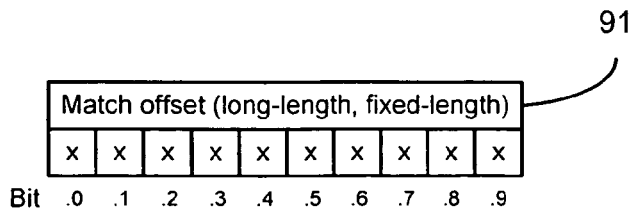
FIGS. 18A to 18C show a table of match offsets of long length according to embodiments of the present invention.
Figure 18B:
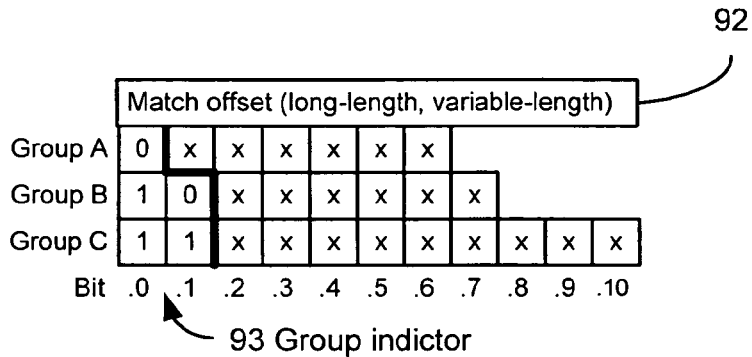
Figure 18C:
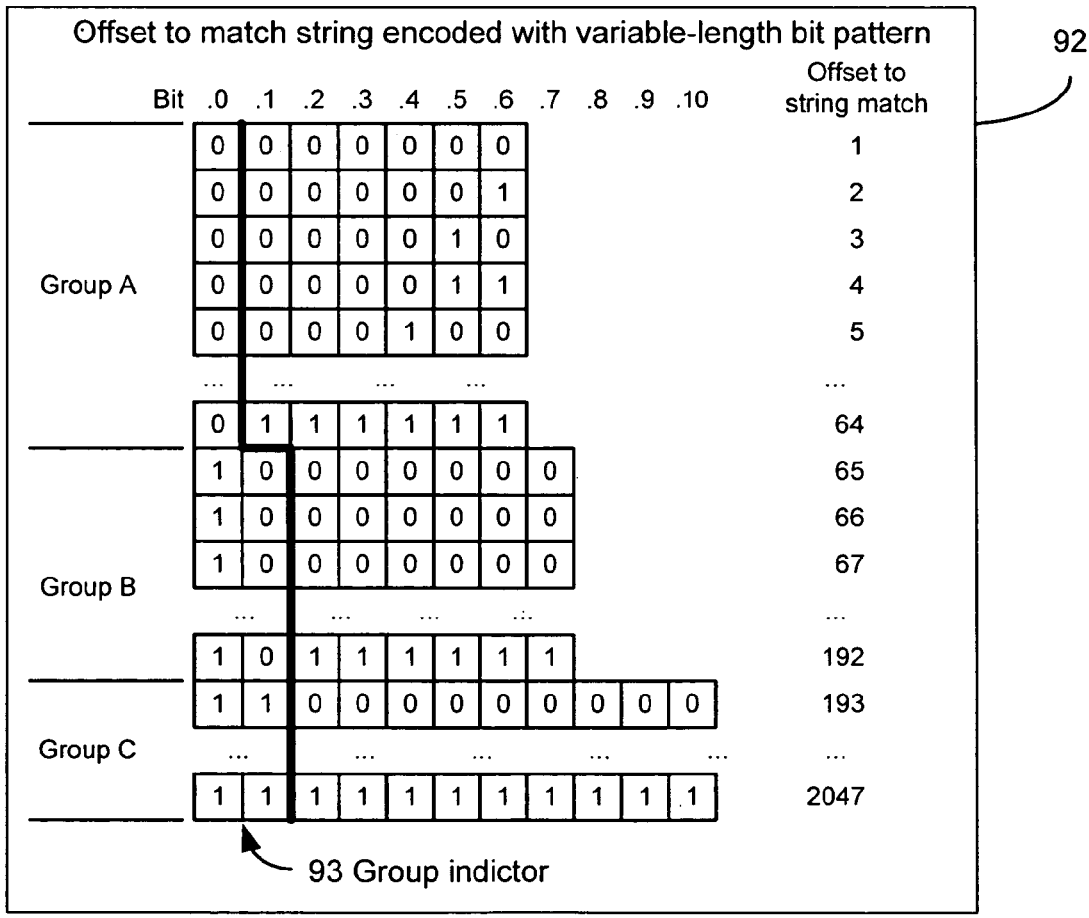

FIGS. 18A to 18C show a table of match offsets of long length according to embodiments of the present invention. The encoding logic 201 may use a fixed-length long match offset 91 to represent the distance to a match. The fixed-length long match offset 91 may include a set number of bits, such as 8 bits, 9 bits, 10 bits as shown, 11 bits, 12 bits or the like.

Alternatively, the encoding logic 201 may use a variable-length long match offset 92 to represent the distance to a match. A variable-length match offset 92 includes a group indicator 93. The group indicator 93 may be variable length, as shown, or may be fixed length. The group indicator 93 indicates the number of bits used to code the offset and how those bits are encoded. For example, a group indicator 93 of "0" (Group A) may be used to indicate that the next 6 bits represent offsets from 1 to 64. A group indicator 93 of "10" (Group B) may be used to indicate that the next 6 bits represent offsets from 65 to 192. A group indicator 93 of "11" (Group C) may be used to indicate that the next 9 bits represent offsets from 193 to 2047.

FIGS. 19A to 19C show a table of match lengths according to embodiments of the present invention. The match length may be formed in ways similar to the match offset. The match length may be encoded as a fixed-length bit sequence 95. A fixed-length match length 95 may include a set number of bits, such as 8 bits, 9 bits, 10 bits as shown, 11 bits, 12 bits or the like.

Alternatively, the match length may be encoded as a variable-length bit sequence 96. The variable-length match length includes a group indicator 97, which indicated the number of bits to follow as well as what match lengths the bits represent. The group indicator 97 may be fixed length, as shown, or may be variable length.

The group indicator 97 shown identifies the one of four groups the encode match length belongs. A group indicator 97 of value "00" indicates a single bit follows to code a match length from 2 to 3. A group indicator 97 of value "01" indicates two bits follow to code a match length from 4 to 7. A group indicator 97 of value "10" indicates three bits follow to code a match length from 8 to 15. A group indicator 97 of value "11" indicates eight bits follow to code a match length from 16 to 271.

The encoding variables and parameters described above are provided as examples. The particular values of the encoding type flag 60, the bit length of a single-character match offset 80, the use of fixed or variable-length match offsets 91, 92 and match lengths 95, 96, the particular values of the group indicators 93, 97, and the number of bits following the group indicators 93, 97 may be selected based on the character of the expected stream of source data 10.

The process of encoding may be reversed with a decoder 103. A decoder 103 may include a serial decoder or a parallel decoder.

Figure 20:
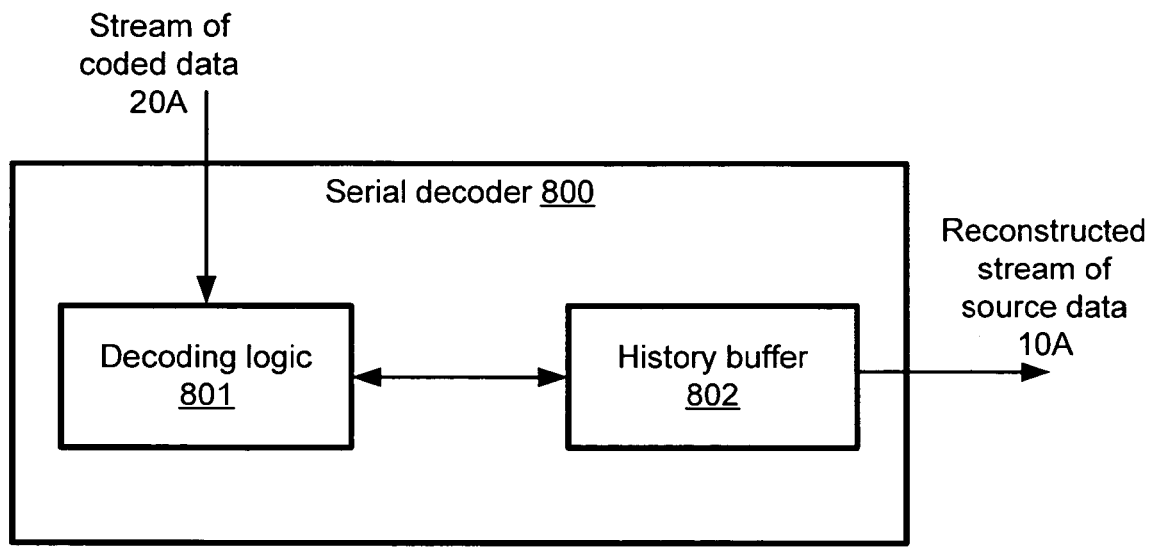
FIGS. 20 and 21 show decoders according to embodiments of the present invention.
Figure 21:
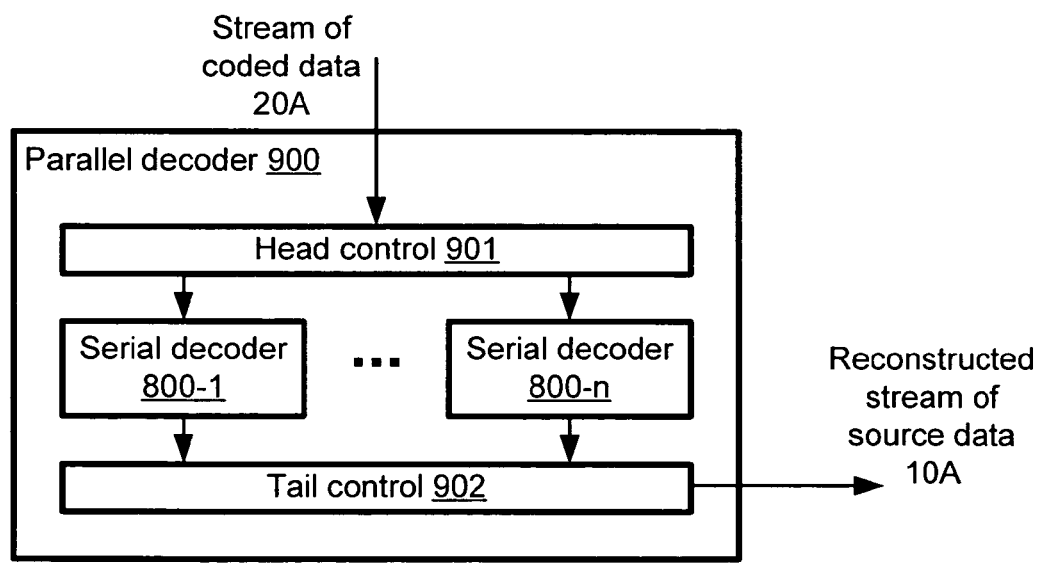

FIGS. 20 and 21 show decoders 103 according to embodiments of the present invention. FIG. 20 shows a serial decoder 800 including decoding logic 801, which accepts a stream of coded data 20A, and a history buffer 802. The history buffer 802 holds the most recent decoded data 10A. The decoding logic 801 reads a coded segment 20A, decodes the coded segments 20A, and writes one or more decoded literal data segments to the history buffer 802. The decoding logic uses the history buffer 802 when an encoded representation (non-literal) is received. The decoding logic 801 reaches back into the history buffer to extract a copy of the repeating data. When a literal is received, the decoding logic 801 extracts a literal value from the coded segment 20A and writes this literal value to the history buffer 802. A serial decoder 800 may be used with data 20A coded with a serial encoder 200 or a parallel encoder 300.

FIG. 21 shows a parallel decoder 900 that includes multiple serial decoders 800-1 to 800-*n*. The parallel decoder 900 also includes a head control 901, which separates the stream of coded data 20A into sub-streams and provides the sub-streams as blocks to respective decoders 800-1 to 800-*n*. That is, the head control 901 provides a sub-stream originally created by one of set of parallel serial encoders 200-1 to 200-*n*. The head control 901 of a parallel decoder 900 may select which serial decoder 800-1 to 800-*n* should be used for each incoming block of encoded data.

The parallel decoder 900 also includes a tail control 902 that concatenates successively decoded blocks and provides a reconstructed stream of source data 10A. The tail control 902 of the parallel decoder 900 may reassemble the reconstructed stream of source data from the blocks of decoded data.

Figure 22:
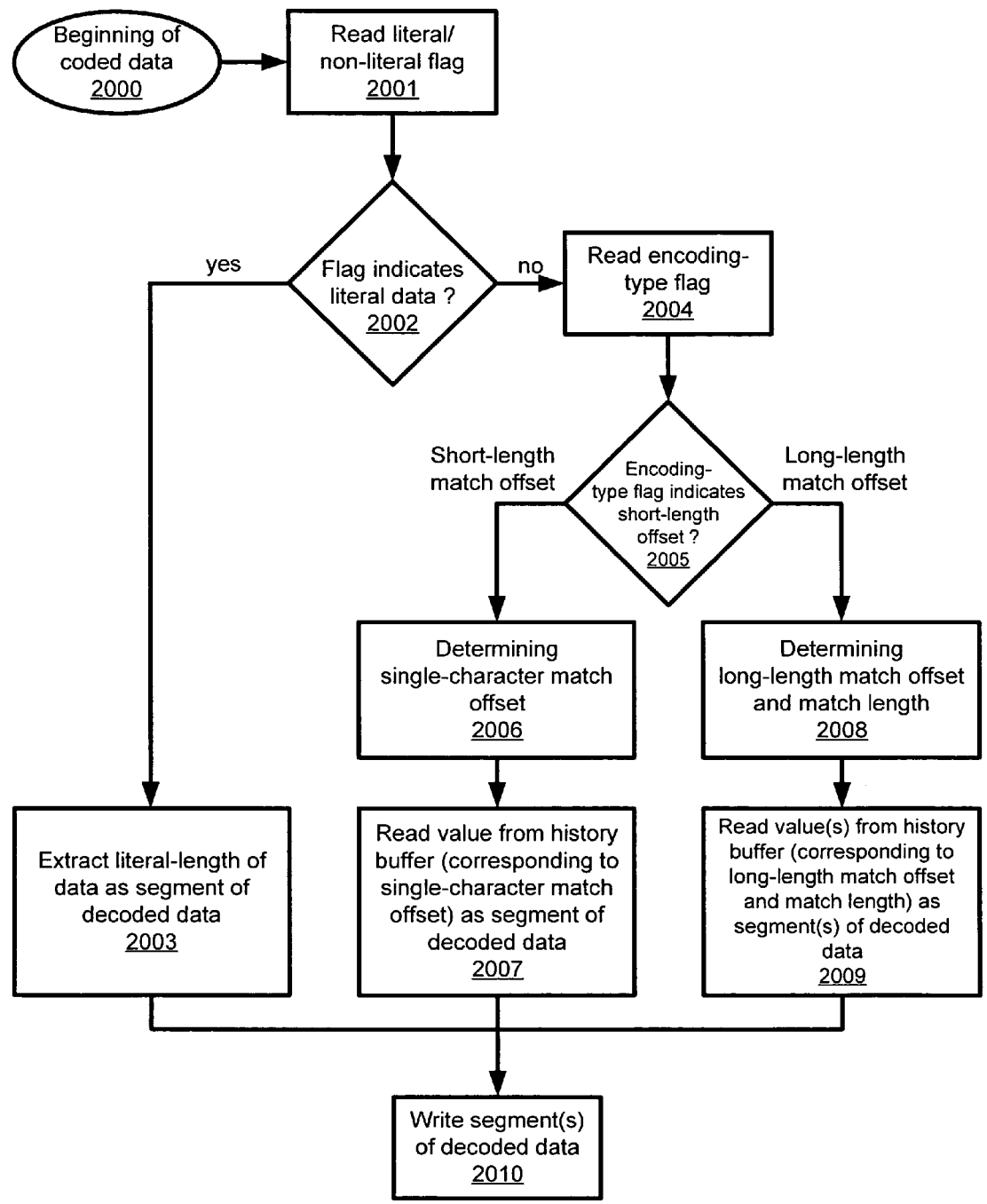
FIG. 22 shows a process of decoding a segment of coded data according to embodiments of the present invention.

FIG. 22 shows a process of decoding a segment of coded data according to embodiments of the present invention. At 2000, the decoding logic receives a segment of coded data 20A. At 2001, the decoding logic reads a flag 30. At 2002, the decoding logic determines whether the following bits are literal data 40 or a variable-length encoded representation 50.

At 2003, if the flag 30 indicates literal data 40, the decoding logic extracts a literal length of data as a segment of decoded data 10A. At 2004, if the flag 30 indicates an encoded representation 50, the decoding logic reads an encoding type flag 60. At 2005, the decoding logic determines whether the encoding type flag 60 indicates a single-character match offset or a long-length match offset. At 2006, if a single-character match offset follows, the decoding logic determines the match offset from the following bits. At 2007, the decoding logic reads a single value from the history buffer at an offset indicated by the match offset. At 2008, if a long-length match offset follows, the decoding logic again determines the match offset from the following bits and also determines the match length. At 2009, the decoding logic reads one or more values as indicated by the match length from the history buffer at an offset indicated by the match offset. As values are read from the history buffer they may be written back to the history buffer at the current location. At 2010, the decoding logic writes the one or more decoded segments as the reconstructed stream of source data 10A.

While the invention has been described in terms of particular embodiments and illustrative figures, those of ordinary skill in the art will recognize that the invention is not limited to the embodiments or figures described.

The figures provided are merely representational and may not be drawn to scale. Certain proportions thereof may be exaggerated, while others may be minimized. The figures are intended to illustrate various implementations of the invention that can be understood and appropriately carried out by those of ordinary skill in the art. Therefore, it should be understood that the invention can be practiced with modification and alteration within the spirit and scope of the appended claims. The description is not intended to be exhaustive or to limit the invention to the precise form disclosed. It should be understood that the invention can be practiced with modification and alteration and that the invention be limited only by the claims and the equivalents thereof.

What is claimed is:

1. A method of encoding digital data, the method comprising:
   searching for a match between a current one or more segments of data and a corresponding one or more past segments of data;
   coding the current segment of data as a literal if no match exists;
   coding the match as a reference if the match exists and the match length greater than 1; and
   if the match exists and a match length is 1:
   determining if a match offset is less than a threshold;
   coding the match as a single-character reference, if the match offset is less than the threshold; and
   coding the match as a literal, if the match offset is greater than the threshold.

2. The method of claim 1, wherein the searching includes:
   reading a new segment of data;
   determining if the new segment of data previously occurred;
   if the new segment of data previously occurred:
   determine a match exists;
   continuing to read a new segment of data until the end of a match is reached;
   determining a match offset and a match length; and if the new segment of data did not previously occur, determining no match exists.

3. The method of claim 1, wherein the coding the current segment of data as the literal includes:
   writing a flag indicating literal data encoding; and
   writing the current segment of data.

4. The method of claim 1, wherein the coding the match as the reference includes:
   writing a flag indicating non-literal data;
   setting an encoding type flag indicated non-literal data encoding;
   writing the encoding type flag;
   writing an indication of the match offset; and
   writing an indication of the match length.

5. The method of claim 4, wherein the indication of the match offset includes the match offset.

6. The method of claim 4, wherein the indication of the match offset includes a variable length encoding of the match offset.

7. The method of claim 6, wherein the variable length value includes a group indicator.

8. The method of claim 4, wherein the indication of the match length includes the match length.

9. The method of claim 4, wherein the indication of the match length includes a variable length encoding of the match length.

10. The method of claim 9, wherein the variable length encoding includes a group indicator.

11. The method of claim 1, wherein the coding the match as the single-character reference includes:
  writing a flag indicating non-literal data;
  setting an encoding type flag indicating single-character reference encoding;
  writing the encoding type flag; and
  writing the match offset.

12. The method of claim 1, wherein the coding the match as the literal includes:
  writing a flag indicating literal data encoding; and
  writing the current segment of data.

13. A method of encoding a stream of data segments, the method comprising:
  loading a new segment of data from the stream of data segments;
  determining if the new segment of data matches a past segment of data;
  if the new segment of data does not match the past segment of data:
    encoding the new segment of data as literal data; and
  if at least a portion of the new segment of data matches at least a portion of the past data:
    determining a length of matching data, wherein the matching data corresponds to the at least a portion of the new segment of data that matches,
    if the length is a single character:
      determining if an offset of the matching data from the past segment of data is within a threshold,
      if the offset of the matching data is within the threshold:
        encoding the new segment of data as a single character match, and if the offset of the matching data is not within the threshold:
        encoding the new segment as literal data;
    if the length of the matching data is greater than a single character:
      encoding the new segment of data as a multi character match.

14. The method of claim 13, wherein the determining if the new segment of data matches the past segment of data includes:
  loading a value from a locate memory corresponding to the new segment of data;
  determining the new segment of data matches past data if the value is not zero; and
  determining the new segment of data does not match past data if the value is zero.

15. The method of claim 13, further comprising updating a locate memory.

16. The method of claim 13, further comprising updating a match register.

17. The method of claim 16, wherein the updating a match register includes:
  loading a value from an a locate memory corresponding to the new segment of data, wherein the locate memory identifies locations of repeated occurrences of past data segments;
  determining a result of a logical AND operation between bits from the loaded value and bits shifted by one from the match registers;
  updating the match register with the logical AND results if any of the bits of the logical AND result is not zero;
  updating the match register with the loaded value from the locate memory if all of the bits of the result are zero.

18. The method of claim 13, further comprising determining the match offset from a match register.

19. The method of claim 18, wherein the determining the match offset from the match register includes counting a number of bit positions from a current position to a first bit set to 1.

20. An encoder comprising:
  encoding logic, wherein the encoding logic includes a table of match offsets to single-characters and a table of match offsets of long length; and
  string matching logic coupled to the encoding logic, wherein the string matching logic includes a locate memory operable to identify locations of repeated occurrences of the past data segments and a match register coupled to the locate memory.

21. The encoder of claim 20, wherein the encoding logic further includes a table of match lengths.

22. The encoder of claim 20, wherein string matching logic further includes a history buffer operable to hold past data segments.

23. A parallel encoder for encoding a source of data, the parallel encoder comprising:
  a plurality of serial encoders, wherein each serial encoder includes:
    encoding logic having an input and an output, wherein the encoding logic includes a table of match offsets to single-characters, and a table of match offsets of long length; and
    string matching logic coupled to the encoding logic, wherein the string matching logic includes a history buffer operable to hold past data segments, a locate memory operable to identify locations of repeated occurrences of the past data segments, and a match register coupled to the locate memory;
  a head control including:
    an input coupled to the source of data; and
    a plurality of outputs, each output coupled to the input of a corresponding one of the plurality of serial encoders; and
  a tail control including:
    a plurality of inputs, each input coupled to the output of a corresponding one of the plurality of serial encoders; and
    an output providing a coded data stream.

24. A parallel decoder for decoding a source of encoded data, the parallel decoder comprising:
  a plurality of serial decoders, wherein each serial decoder includes:
    decoding logic, wherein the decoding logic includes a table of match offsets to single-characters and a table of match offsets of long length; and
    a history buffer operable to hold decoded data segments;
  a head control including:
    an input coupled to the source of encoded data; and a plurality of outputs, each output coupled to the input of a corresponding one of the plurality of serial decoders; and a tail control including:
a plurality of inputs, each input coupled to the output of a corresponding one of the plurality of serial decoders; and
an output providing a decoded data stream.

25. A method of decoding coded data, the method comprising:
determining a beginning of coded data;
reading a flag indicating whether the coded data contains literal data or an encoded representation;
if the flag indicates literal data, extracting a literal length of data thereby forming a segment of decoded data;
if the flag indicates the encoded representation:
reading an encoding-type flag indicating whether the encoded representation includes a single-character match offset or a long-length match offset;
if the encoding-type flag indicates the single-character match offset:
determining the single-character match offset; and
determining a value from a history buffer corresponding to the single-character match offset, thereby forming the segment of decoded data; and
if the encoding-type flag indicates the long-length match offset:
determining the long-length match offset;
determining a match length; and
reading one or more values from the history buffer corresponding to the long-length match offset and the match length, thereby forming a corresponding one or more segments of decoded data.

26. The method of claim 25, wherein determining the long-length match offset includes:
determining a length of the long-length match offset;
reading a number of bits corresponding to the determined length; and
setting the long-length match offset based on the read bits.

27. The method of claim 25, wherein determining the long-length match offset includes:
reading a group indicator;
reading a number of bits corresponding to the group indicator; and
setting the long-length match offset based on the read bits.

28. The method of claim 25, wherein determining the match length includes:
determining a length of the match length;
reading a number of bits corresponding to the determined length; and
setting the match length based on the read bits.

29. The method of claim 25, wherein determining the match length includes:
reading a group indicator;
reading a number of bits corresponding to the group indicator; and
setting the match length based on the read bits.

30. A magnetic tape drive comprising:
an encoder including:
encoding logic, wherein the encoding logic includes a table of match offsets to single-characters and a table of match offsets of long length; and
string matching logic coupled to the encoding logic, wherein the string matching logic includes a locate memory operable to identify locations of repeated occurrences of the past data segments and a match register coupled to the locate memory; and
a decoder including:
decoding logic, wherein the decoding logic includes a table of match offsets to single-characters and a table of match offsets of long length; and
a history buffer operable to hold decoded data segments.

31. A method of encoding a stream of data, the method comprising:
selecting from three formats a format to encode a segment of the stream of data, wherein:
a first format represents the segment as a literal including the segment;
a second format represents the segment as a reference including an offset to a single-character match to a previous segment, wherein the previous segment is determined to be within a threshold offset; and
a third format represents the segment as a reference including an indication of a match offset and an indication of a match length.

32. The method of claim 31, wherein:
the first format further including a cleared bit immediately preceding the segment;
the second format further including a set bit and a cleared bit pair immediately preceding the offset to the single-character match; and
the third format further including a pair of set bits immediately preceding the indication of the match offset and the indication of the match length.

33. The method of claim 31, further comprising:
forming bit pattern in the selected format; and
writing the bit pattern.

34. A method of encoding a stream of data, the method comprising:
selecting from four formats a format to encode a segment of the stream of data, wherein:
a first format represents the segment as a literal including the segment;
a second format represents the segment as a reference including an offset to a single-character match to a previous segment, wherein the previous segment is determined to be within a threshold offset;
a third format represents the segment as a reference including an offset to a double-character match to a previous segment; and
a fourth format represents the segment as a reference including an indication of a match offset and an indication of a match length.

* * * * *